(12) United States Patent
Takahashi et al.

(10) Patent No.: US 7,592,674 B2
(45) Date of Patent: Sep. 22, 2009

(54) SEMICONDUCTOR DEVICE WITH SILICIDE-CONTAINING GATE ELECTRODE AND METHOD OF FABRICATING THE SAME

(75) Inventors: Kensuke Takahashi, Tokyo (JP); Kenzo Manabe, Tokyo (JP); Nobuyuki Ikarashi, Tokyo (JP); Toru Tatsumi, Tokyo (JP)

(73) Assignee: NEC Corporation, Tokyo (JP)

( * ) Notice: Subject to any disclaimer, the term of this patent is extended or adjusted under 35 U.S.C. 154(b) by 428 days.

(21) Appl. No.: 10/575,785

(22) PCT Filed: Jun. 21, 2005

(86) PCT No.: PCT/JP2005/011331

§ 371 (c)(1),
(2), (4) Date: Apr. 14, 2006

(87) PCT Pub. No.: WO2006/001271

PCT Pub. Date: Jan. 5, 2006

(65) Prior Publication Data

US 2007/0138580 A1    Jun. 21, 2007

(30) Foreign Application Priority Data

Jun. 23, 2004    (JP) .............................. 2004-184758

(51) Int. Cl.
*H01L 29/78*    (2006.01)
*H01L 21/8234*  (2006.01)
*H01L 21/8238*  (2006.01)

(52) U.S. Cl. .................. 257/369; 257/407; 257/411; 257/412; 257/E29.161; 257/E21.199; 438/592

(58) Field of Classification Search .................. 257/407
See application file for complete search history.

(56) References Cited

U.S. PATENT DOCUMENTS 7,098,516 B2 *  8/2006  Colombo et al. ............ 257/412

(Continued)

FOREIGN PATENT DOCUMENTS

CN    1503350 A    6/2004

(Continued)

OTHER PUBLICATIONS

Lee, JH, et al., "Tunable Work Function Dual Metal Gate Technology for Bulk and Non-Bulk CMOS", IEEE (2002).

(Continued)

*Primary Examiner*—Stephen W Smoot
(74) *Attorney, Agent, or Firm*—Whitham Curtis Christofferson & Cook, PC

(57) ABSTRACT

There is provided a semiconductor device which is capable of solving a problem of threshold control in CMOS transistor, accompanied with combination of a gate insulating film having a high dielectric constant and a metal gate electrode, and significantly enhancing performances without deterioration in reliability of a device. The semiconductor device includes a gate insulating film composed of a material having a high dielectric constant, and a gate electrode. A portion of the gate electrode making contact with the gate insulating film has a composition including silicide of metal M expressed with $M_xSi_{1-x}$ ($0<X<1$), as a primary constituent. X is greater than 0.5 ($X>0.5$) in a p-type MOSFET, and is equal to or smaller than 0.5 ($X \leq 0.5$) in a n-type MOSFET.

36 Claims, 10 Drawing Sheets

U.S. PATENT DOCUMENTS

| | | | |
|---|---|---|---|
| 2003/0143825 A1 | 7/2003 | Matsuo et al. | 438/585 |
| 2005/0280104 A1* | 12/2005 | Li | 257/406 |
| 2006/0258156 A1* | 11/2006 | Kittl | 438/682 |

FOREIGN PATENT DOCUMENTS

| | | |
|---|---|---|
| JP | 2003-258121 | 9/2003 |
| JP | 2004-152995 | 5/2004 |
| JP | 2004-158593 | 6/2004 |

OTHER PUBLICATIONS

Kedzierski, J., et al., "Metal-gate FinFET and fully-depleted SOI devices using total gate silicidation", IEEE (2002.

Kedzierski, J., et al., "Threshold voltage control in NiSi-gated MOSFETs through silicidation induced impurity segregation (SIIS)", IEEE (2003).

Maszara, W.P., et al., "Transistors with Dual Work Function Gates by Single Full Silicidation (FUSI) of Polysilicon Gates", IEEE (2002), pp. 367-370.

Terai, M., et al., "Highly Reliable HfSiON CMOSFET with Phase Controlled NiSi (NFET) and Ni3Si (PFET) FUSI Gate Electrode", Symposium on VLSI Technology Digest of Technical Papers (2005), pp. 68-69.

K. Takahashi, et al., "Dual Workfunction Ni-Silicide/HfSiON Gate Stacks by Phase-Controlled Full Silicidation (PC-FUSI) Technique for 45nm-node LSTP and LOP Devices", IEEE, Dec. 2004, pp. 91-94.

An Office Action issed by the Chinese Patent Office on Mar. 14, 2008, in relation to the counterpart application pp. 1 to 12.

An Office Action issued by the Chinese Patent Office on Sep. 14, 2007, in regard of the related application with English and Japanese language translations, pp. 1 to 18.

* cited by examiner

[FIG.1]
PRIOR ART
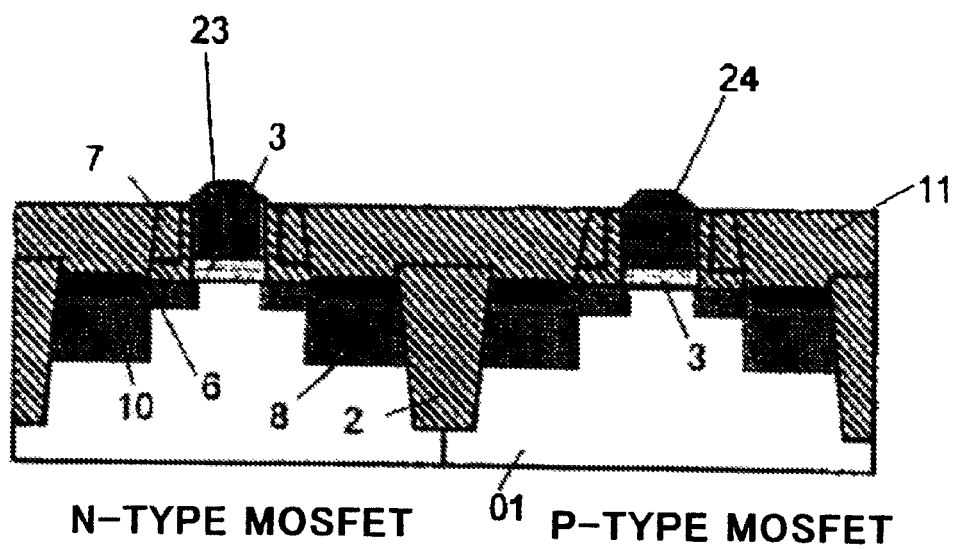
N-TYPE MOSFET    P-TYPE MOSFET
[FIG.2]
PRIOR ART
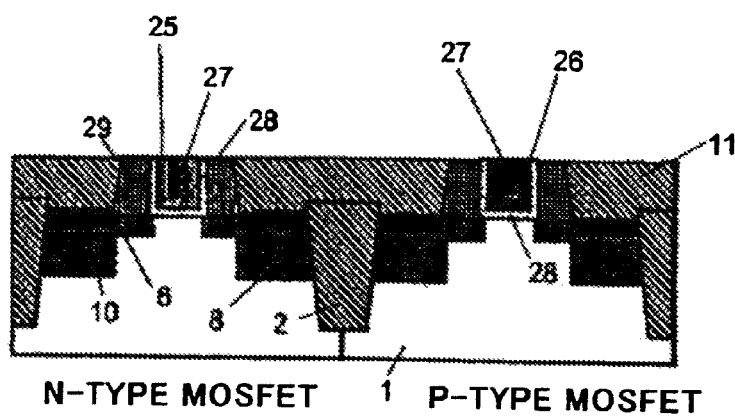
N-TYPE MOSFET    P-TYPE MOSFET

[FIG.3]
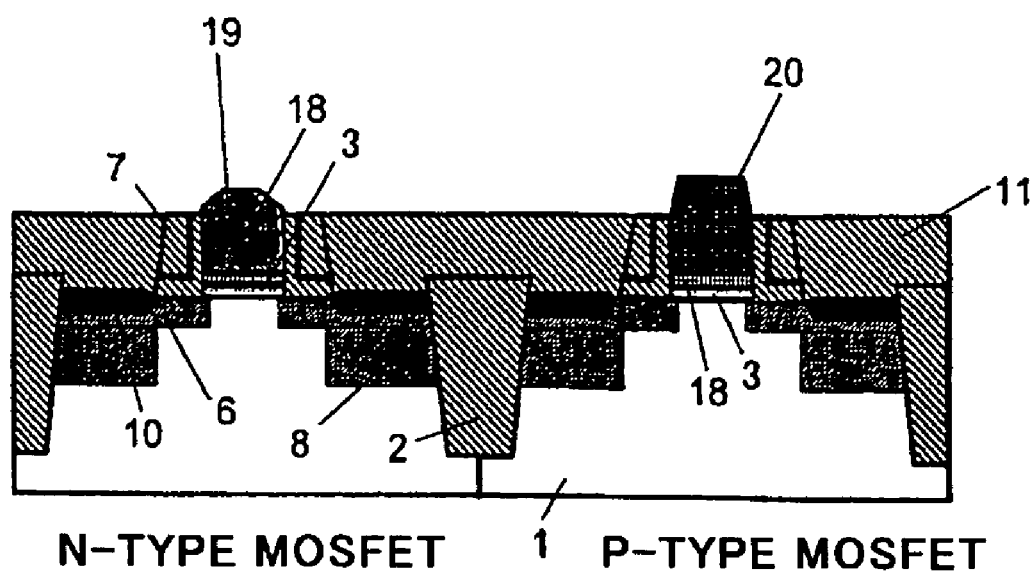

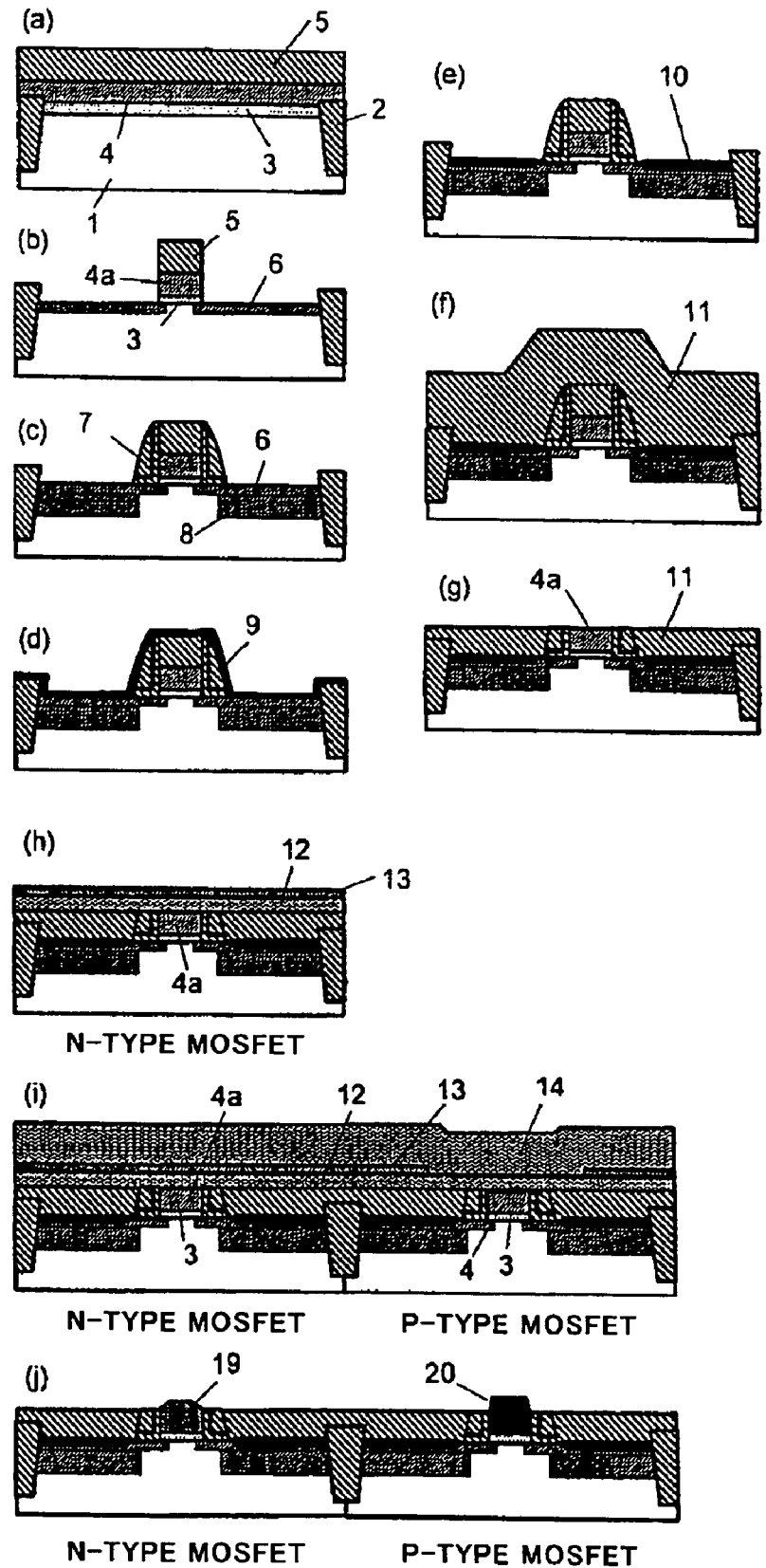
[FIG.4]

[FIG.5]
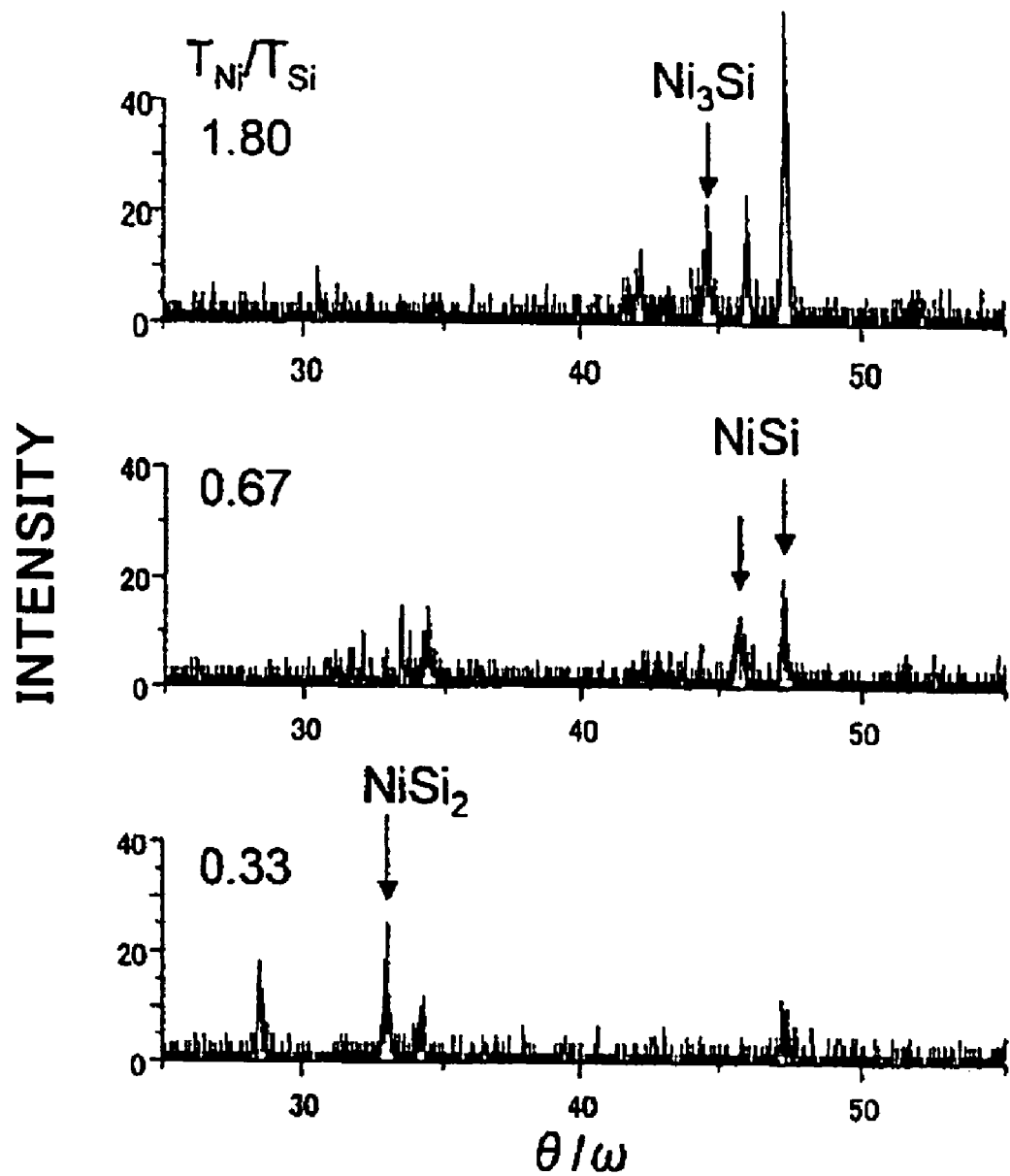

[FIG.6]
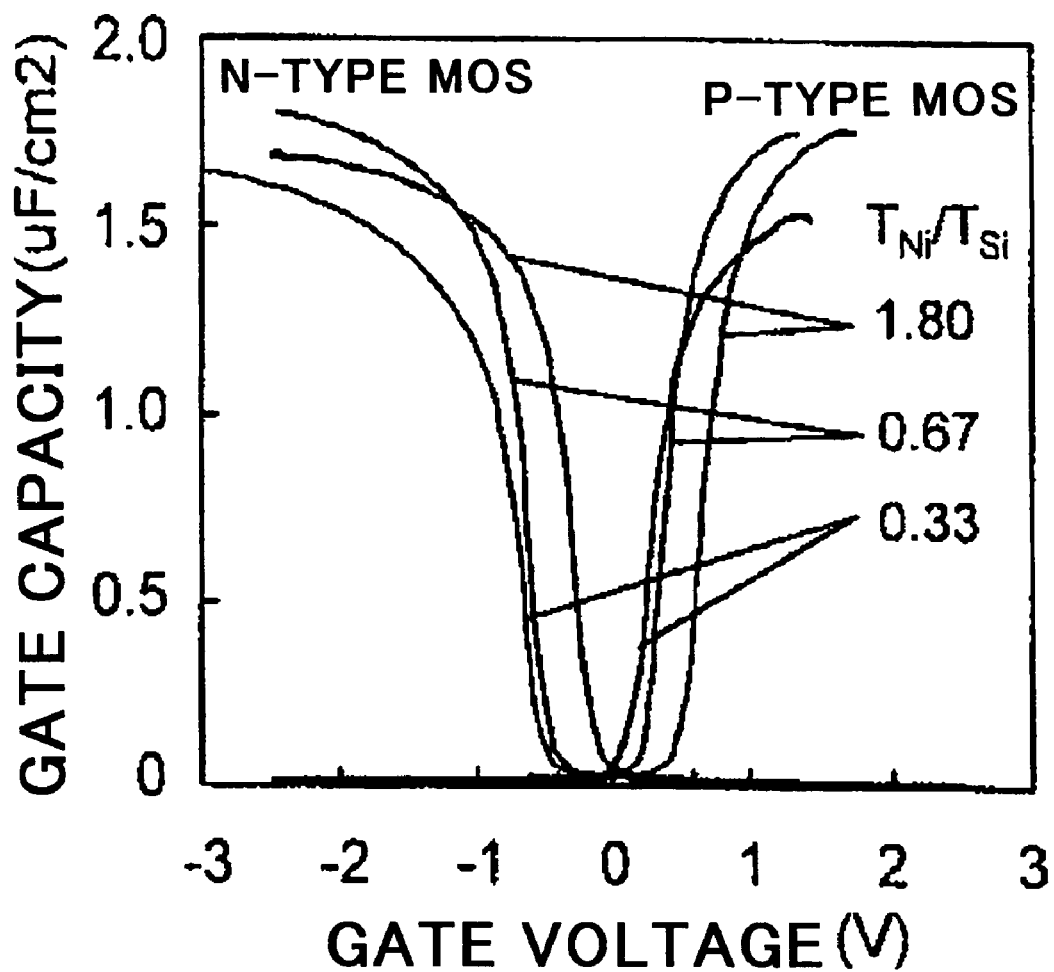

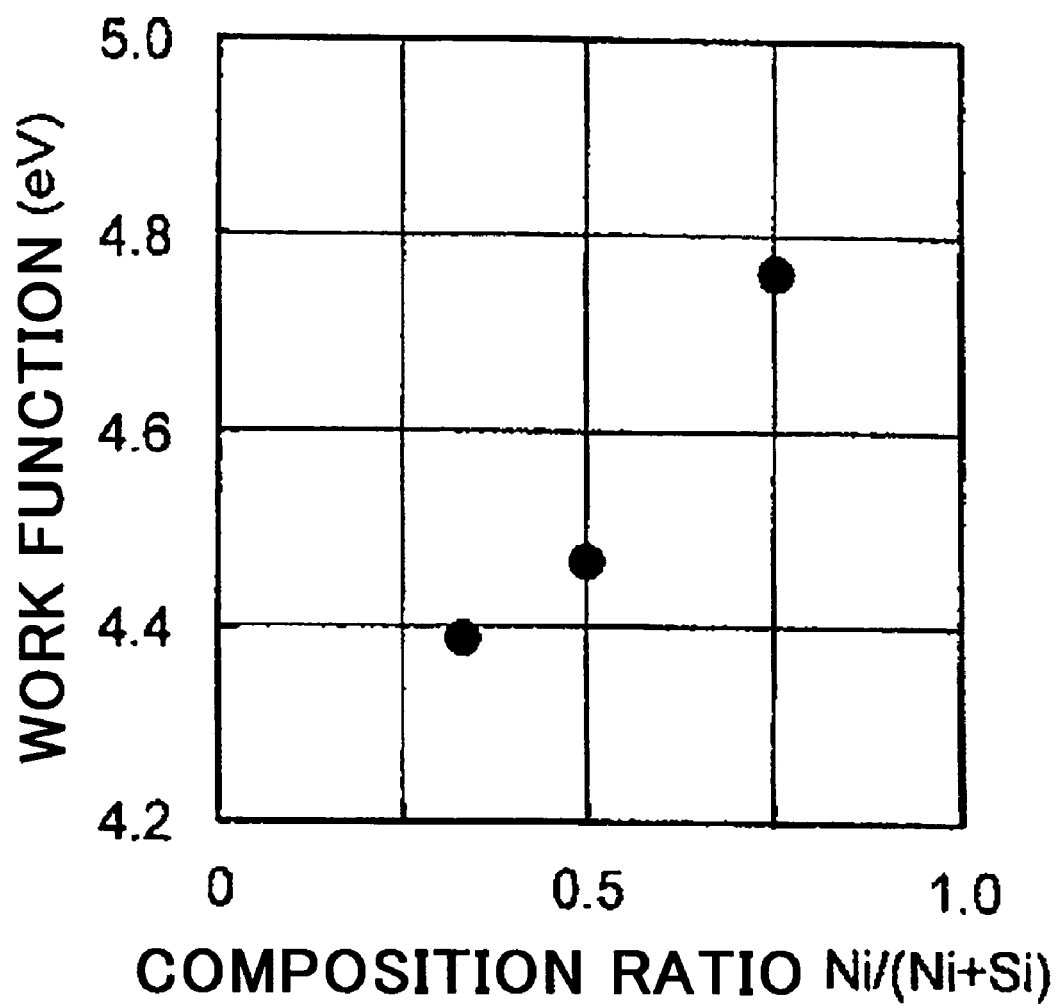
[FIG.7]

[FIG.8]
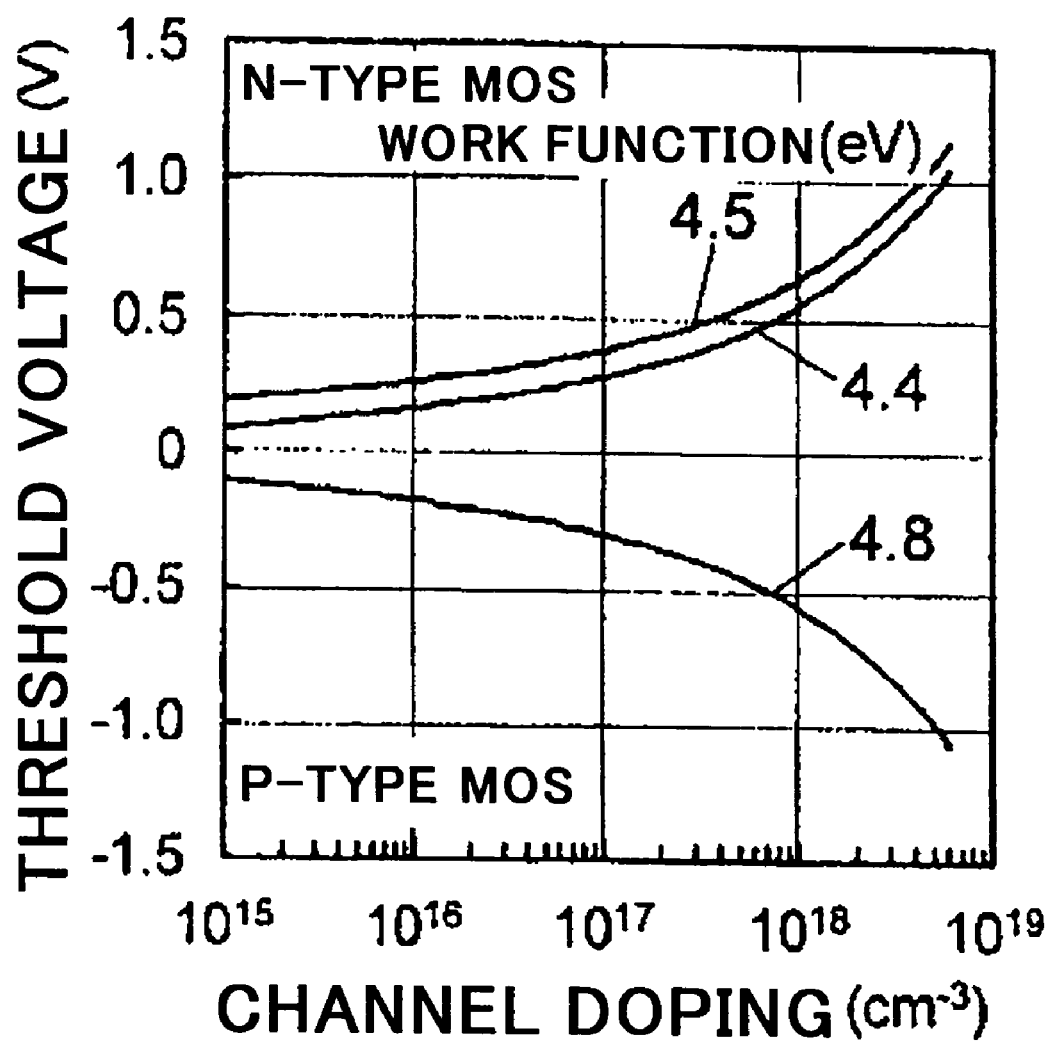

[FIG.9]
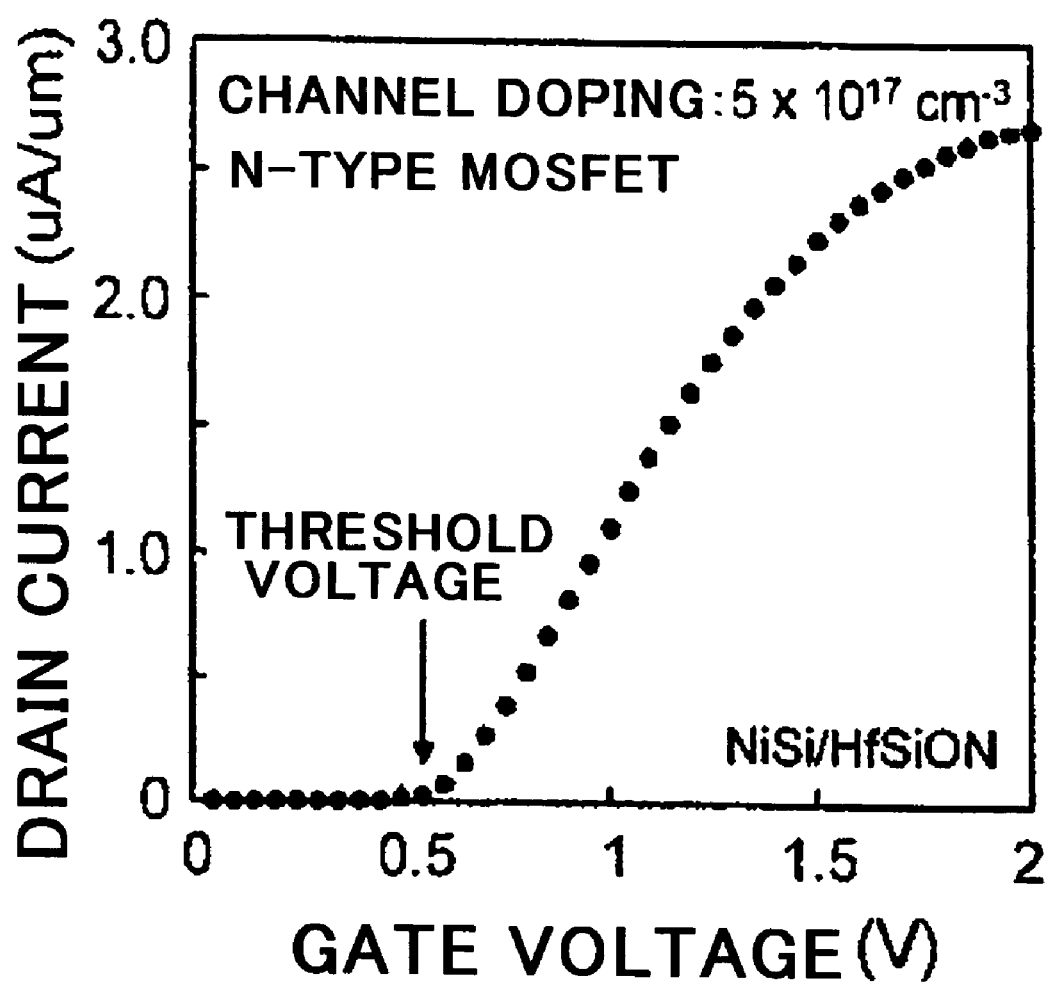

[FIG.10]
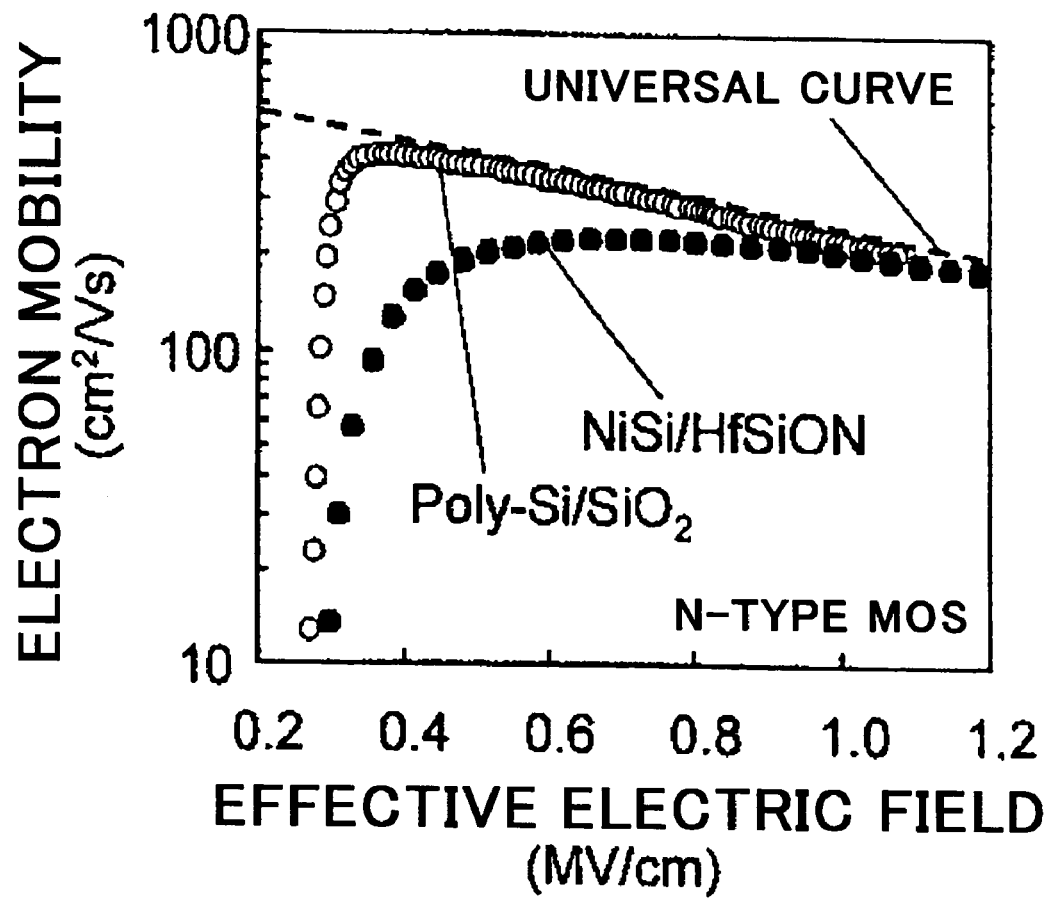
[FIG.11]
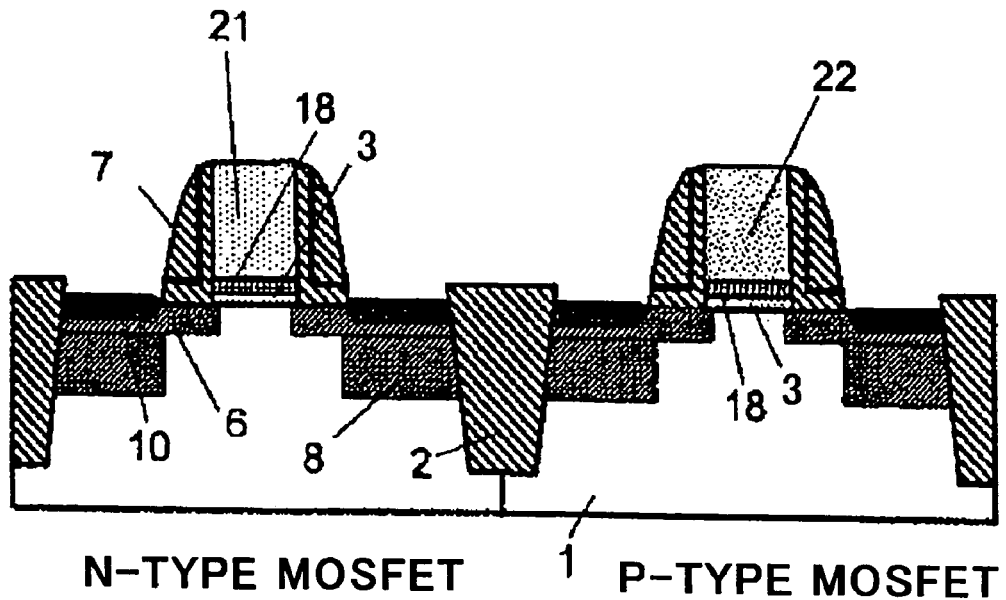

[FIG.12]
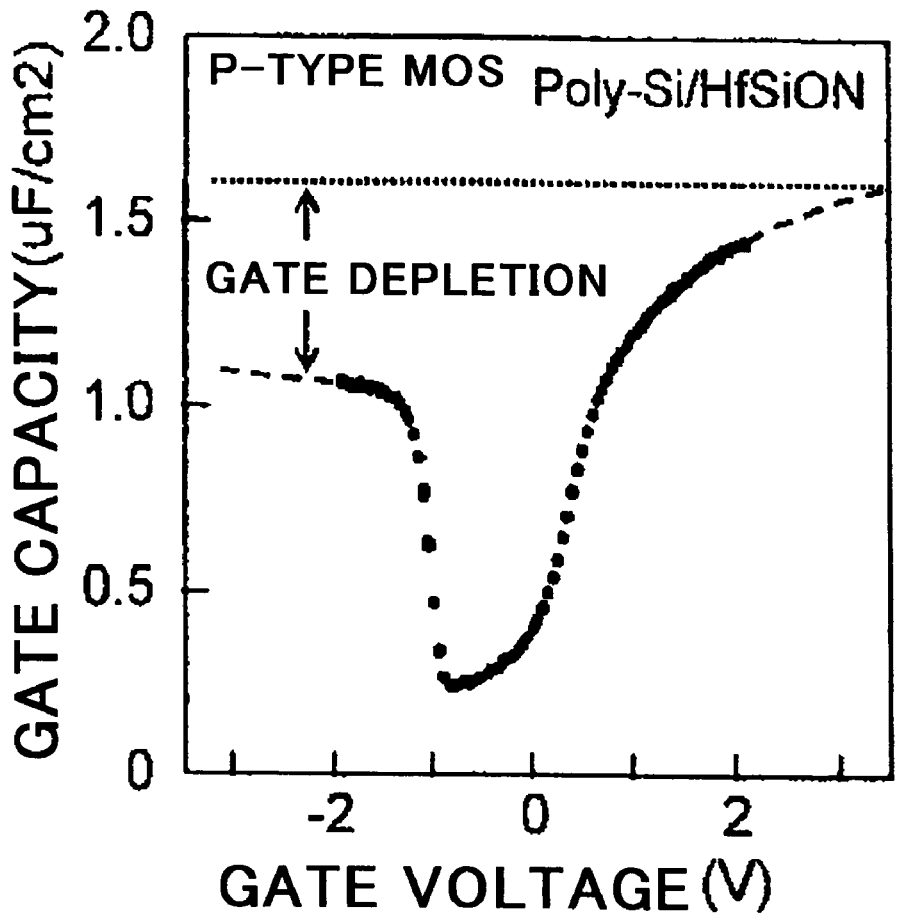
[FIG.13]
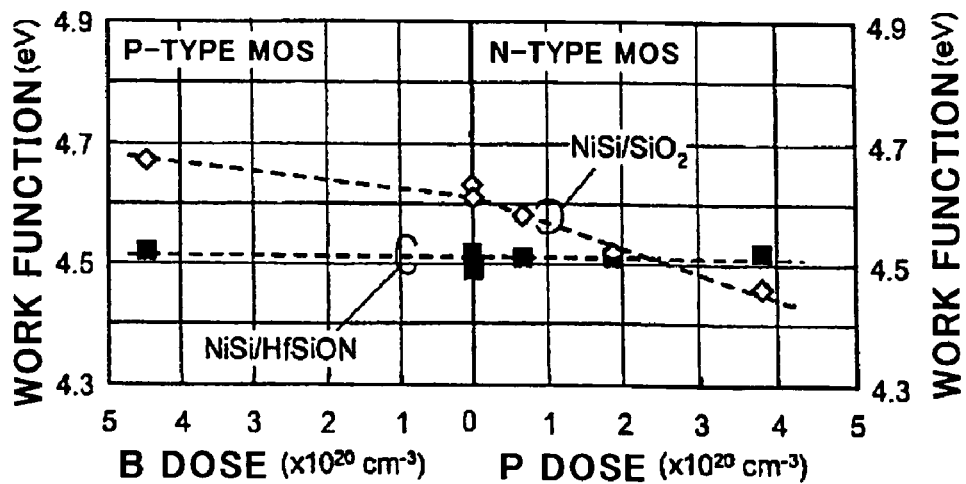

SEMICONDUCTOR DEVICE WITH SILICIDE-CONTAINING GATE ELECTRODE AND METHOD OF FABRICATING THE SAME

BACKGROUND OF THE INVENTION

1. Field of the Invention

The invention relates to a semiconductor device including an insulating film having a high dielectric constant and a method of fabricating the same, and more particularly to MOSFET (Metal Oxide Semiconductor Field Effect Transistor) accomplishing high performances and high reliability.

2. Description of the Related Art

In the development of a CMOS (Complementary MOS) device having a transistor which is as small as possible, there are problems of reduction in a drive current due to depletion of a poly-silicon (poly-Si) electrode, and increase in a gate leak current due to reduction in a thickness of a gate insulating film. Hence, there is studied combined technology for avoiding depletion of a poly-silicon electrode through the use of a metal gate electrode, and further for reducing a gate leak current by composing a gate insulating film of a material having a high dielectric constant to thereby physically thicken a gate insulating film.

As a material of which a metal gate electrode is to be composed, there are pure metal, metal nitride and silicide. Whichever material is used, it is required to be able to set a threshold voltage (Vth) to be an appropriate voltage in both n-type and p-type MOSFETs.

In order to accomplish a threshold voltage (Vth) equal to or smaller than ±0.5 eV in CMOSFET, it would be necessary to compose a gate electrode of a material having a work function equal to or smaller than a mid-gap (4.6 eV) of silicon (Si) or preferably equal to or smaller than 4.4 eV in n-type MOSFET, or a material having a work function equal to or greater than a mid-gap (4.6 eV) of silicon (Si) or preferably equal to or greater than 4.8 eV in p-type MOSFET.

To this end, there has been suggested a method of controlling a threshold voltage (Vth) in CMOSFET by composing gate electrodes of metals or alloys having different work functions from one another in n-type and p-type MOSFETs. Such a method is generally called "dual metal gate".

For instance, the non-patent reference 1 sets forth that tantalum (Ta) and ruthenium (Ru) formed on silicon dioxide ($SiO_2$) have work functions of 4.15 eV and 4.95 eV, respectively, and it is possible to modulate a work function by 0.8 eV between gate electrodes composed of these two metals.

A silicide electrode comprising a poly-Si electrode completely turned into silicide with nickel (Ni), hafnium (Hf) or tungsten (W) recently draws attention.

For instance, FIG. 1 is a cross-sectional view of a CMOS transistor suggested in the non-patent references 2 and 3.

A CMOS transistor illustrated in FIG. 1 includes a silicon substrate 1, and a device isolation film 2 formed at a surface of and in the silicon substrate 1. Each of regions sandwiched between the device isolation films 2 disposed adjacent to each other defines an area in which a transistor is to be fabricated.

As illustrated in FIG. 1, an n-type MOSFET and a p-type MOSFET are fabricated in the areas. Each of the n-type and p-type MOSFETs is comprised of a gate insulating film 3 formed on the silicon substrate 1, a gate electrode 23, 24 formed on the gate insulating film 3, a gate sidewall 7 surrounding a sidewall of the gate electrode 23, 24 therewith, an interlayer insulating film 11 surrounding the gate sidewall 7 therewith and formed on the silicon substrate 1, a silicide layer 10 formed around the gate sidewall 7 at a surface of the silicon substrate 1, an extended diffusion region 6 formed around the gate electrode 23, 24 in the silicon substrate 1, and source/drain diffusion layers 8 formed around the gate sidewall 7 and below the extended diffusion region 6 in the silicon substrate 1.

The gate insulating film 3 is composed of silicon dioxide ($SiO_2$). The gate electrode 23 of the n-type MOSFET is composed of nickel silicide (NiSi) formed by turning poly-silicon completely into silicide with nickel (Ni), and introducing phosphorus (P) into the silicide as an impurity. The gate electrode 24 of the p-type MOSFET is composed of nickel silicide (NiSi) formed by turning poly-silicon completely into silicide with nickel (Ni), and introducing boron (B) into the silicide as an impurity.

It is said in the non-patent references 2 and 3 that it is possible to modulate a work function of a gate electrode by 0.5 eV at greatest by using the above-mentioned gate insulating film 3 and gate electrodes 23, 24. The process suggested in the non-patent references 2 and 3 is characterized in that it is possible to turn a poly-silicon electrode into silicide after impurities included in source/drain diffusion regions in CMOS are annealed for activation, ensuring that the process matches well with a conventional CMOS process.

The non-patent references 2 and 3 disclose that if a gate insulating film is composed of SiON, NiSi and $NiSi_2$ of which gate electrodes are composed have work functions of about 4.6 eV and about 4.45 eV, respectively.

FIG. 2 is a cross-sectional view of a CMOS transistor suggested in the patent reference 1.

A CMOS transistor illustrated in FIG. 2 is comprised of a silicon substrate 1, a device isolation film 2 formed at a surface of and in the silicon substrate 1 for defining areas in each of which a transistor is to be fabricated, a gate insulating film 28 formed on the silicon substrate 1, a gate electrode surrounded with the gate insulating film 28, a gate sidewall 29 surrounding a sidewall of the gate electrode therewith, an interlayer insulating film 11 surrounding the gate sidewall 29 therewith and formed on the silicon substrate 1, a silicide layer 10 formed around the gate sidewall 29 at a surface of the silicon substrate 1, an extended diffusion region 6 formed around the gate electrode in the silicon substrate 1, and source/drain diffusion layers 8 formed around the gate sidewall 29 and below the extended diffusion region 6 in the silicon substrate 1

The gate electrode of the n-type MOSFET is comprised of a tungsten film 27, and a tungsten silicide film 28 surrounding the tungsten film 27 therewith, and the gate electrode of the p-type MOSFET is comprised of a tungsten film 26, and a tungsten film 27 surrounding the tungsten film 26 therewith.

As mentioned above, in the CMOS transistor illustrated in FIG. 2, the gate electrodes are comprised of tungsten (W) and tungsten silicide in accordance with a gate substitution process. That is, in order to control threshold voltages (Vth) in the n-type and p-type MOSFETs, the gate electrodes thereof are composed of tungsten and tungsten silicide, respectively, or the composition of tungsten silicide is varied.

Specifically, a tungsten film or a tungsten silicide film are formed entirely on a substrate, and then, a silicon (Si) film and a tungsten film are formed on the tungsten film and the tungsten silicide film, respectively. Thereafter, a portion of the silicon film disposed on the tungsten film in the p-type MOSFET region and a portion of the tungsten film disposed on the tungsten silicide film in the n-type MOSFET region are removed. Then, the tungsten film and the silicon film are caused to react with each other by annealing or the tungsten silicide film and the tungsten film are caused to react with each other by annealing to thereby form the tungsten silicide electrode and the tungsten electrode in the n-type and p-type MOSFET regions, respectively, or vary the composition of the tungsten silicide for controlling a work function of the gate electrodes.

The above-mentioned patent and non-patent references are defined as follows.

Patent reference 1: Japanese Patent Application Publication No. 2003-258121

Non-patent reference 1: International electron devices meeting technical digest 2002, p. 359

Non-patent reference 2: International electron devices meeting technical digest 2002, p. 247

Non-patent reference 3: International electron devices meeting technical digest 2002, p. 315

SUMMARY OF THE INVENTION

However, the above-mentioned prior art is accompanied with the following problems.

In the dual metal gate process in which metals or alloys having work functions different from one another are used, it is necessary to carry out a step of etching a layer formed on a gate of either the p-type or n-type MOSFET for removal. However, this process is accompanied with a problem that a gate insulating film is degraded in the etching step, resulting in deterioration in performances and reliability of a resultant device.

As detailed in the later-mentioned reference example 2, the process of modulating a threshold voltage (Vth) by means of a silicide electrode to which impurities are doped is accompanied with a problem that it is not possible to control a work function of a gate electrode, it a gate insulating film is composed of a material having a high dielectric constant.

In the process of modulating a work function by composing the gate electrodes of NiSi and $NiSi_2$, respectively, the work function changes into a smaller one. Hence, it is questionable to apply the process to a p-type MOSFET. Furthermore, as explained in the later-mentioned embodiment 1, if a gate insulating film is comprised of an insulating film having a high dielectric constant, a difference in a work function between the gate electrode and the gate insulating film is equal to or smaller than 0.1 eV, resulting in that the modulation is suppressed.

The process for changing the composition of tungsten silicide to change a work function of a gate electrode is accompanied with a problem that since tungsten silicide is formed at a relatively high temperature, specifically, at 500 degrees centigrade or higher, a silicide layer formed in source/drain diffusion regions would be highly resistive.

Furthermore, since the composition ratio of tungsten silicide and a work function of a gate electrode are in linear relation with each other, even slight non-uniformity in the composition ratio (for instance, non-uniformity in a thickness of a tungsten or silicon film, and non-uniformity in in-plane profile of the same) would cause fluctuation in the work function, resulting in reduction in reproduction and uniformity of a device.

Furthermore, when a tungsten film and a silicon film are caused to react with each other to make silicon-rich tungsten silicide, there might cause peeling in an interface between a gate insulating film and a gate electrode.

In view of the above-mentioned problems in the prior art, it is an object of the present invention to provide a semiconductor device and a method of fabricating the same both of which are capable of solving the above-mentioned problems, and enhancing performances and reliability of a resultant semiconductor device.

In one aspect of the present invention, there is provided a semiconductor device including a silicon substrate, a gate insulating film formed on the silicon substrate, and a gate electrode formed on the gate insulating film, in this order, wherein the gate insulating film includes an electrically insulating film having a high dielectric constant and containing one of metal oxide, metal silicate and metal oxide or metal silicate containing nitrogen therein, the gate electrode contains silicide of metal M as a primary constituent, and has a region through which the gate electrode makes contact with the gate insulating film and which has a composition expressed with $M_XSi_{1-X}$ (0<X<1), and the X is greater than 0.5 (X>0.5) in the silicide contained in a gate electrode formed above a p-channel, and the X is equal to or smaller than 0.5 (X≦0.5) in the silicide contained in a gate electrode formed above a n-channel. The metal M is selected from nickel (Ni), platinum (Pt), tantalum (Ta), titanium (Ti), hafnium (Hf), cobalt (Co), zirconium (Zr) and vanadium (V).

It is preferable that the gate electrode contains nickel silicide as a primary constituent, and assuming that a region of the nickel silicide making contact with the gate insulating film is expressed with $Ni_XSi_{1-X}$ (0<X<1), the X is equal to or greater than 0.6 and smaller than 1 (0.6≦X<1) in the nickel silicide contained in a gate electrode formed above a p-channel, and the X is greater than 0 and equal to or smaller than 0.5 (0<X≦0.5) in the nickel silicide contained in a gate electrode formed above a n-channel.

It is preferable that the nickel silicide contained in the gate electrode formed above the p-channel contains $Ni_3Si$ phase as a principal constituent at least in a region through which the nickel silicide makes contact with the gate insulating film, and the nickel silicide contained in the gate electrode formed above the n-channel contains one of NiSi phase and $NiSi_2$ phase as a principal constituent at least in a region through which the nickel silicide makes contact with the gate insulating film.

It is preferable that the electrically insulating film contains one of Hf and Zr.

It is preferable that the semiconductor device further includes a layer containing one of Hf and Zr therein between the electrically insulating film and the gate electrode.

The electrically insulating film may be designed to have a multi-layered structure including, for instance, a silicon oxide film or a silicon nitride film, and a Hf-containing layer or a Zr-containing layer.

It is preferable that the electrically insulating film contains HfSiON.

It is preferable that the semiconductor device further includes a HFSiON layer between the electrically insulating film and the gate electrode.

The electrically insulating film may be designed to have a multi-layered structure including, for instance, a silicon oxide film or a silicon nitride film, and a HFSiON layer.

The present invention further provides a semiconductor device including a silicon substrate, a gate insulating film formed on the silicon substrate, and a gate electrode formed on the gate insulating film, characterized in that at least a region of the gate electrode making contact with the gate insulating film is composed of silicide containing $Ni_3Si$ phase as a principal constituent.

It is preferable that the gate insulating film includes an electrically insulating film having a high dielectric constant and containing one of metal oxide, metal silicate and metal oxide or metal silicate containing nitrogen therein, It is preferable that the electrically insulating film contains one of Hf and Zr.

It is preferable that the semiconductor device further includes a layer containing one of Hf and Zr therein between the electrically insulating film and the gate electrode.

The electrically insulating film may be designed to have a multi-layered structure including, for instance, a silicon oxide film or a silicon nitride film, and a Hf-containing layer or a Zr-containing layer.

It is preferable that the electrically insulating film contains HfSiON.

It is preferable that the semiconductor device further includes a HFSiON layer between the electrically insulating film and the gate electrode.

The electrically insulating film may be designed to have a multi-layered structure including, for instance, a silicon oxide film or a silicon nitride film, and a HfSiON layer.

It is preferable that the gate electrode is included in a p-type MOSFET, for instance.

The present invention further provides a method of fabricating the above-mentioned semiconductor device, including depositing poly-silicon (poly-Si) on a gate insulating film and patterning the poly-silicon into a gate electrode having desired dimension, depositing one of metals selected from Ni, Pt, Ta, Ti, Hf, Co, Zr and V on the gate electrode, thermally annealing the gate electrode and the one of metals to entirely turn the gate electrode to silicide of the one of metals, and removing a portion of the one of metals which was not turned into the silicide, by etching, assuming that the one of metals is expressed with M, and the silicide has a portion through which the silicide makes contact with the gate insulating film and which has a composition expressed with $M_XSi_{1-X}$ (0<X<1), wherein the metal M has such a thickness t1 above a p-channel device that, when poly-silicon and the metal M react with each other to make silicide, a portion of the silicide making contact with the gate insulating film has composition expressed with $M_XSi_{1-X}$ (0.5<X<1), and has such a thickness t2 above a n-channel device that, when poly-silicon and the metal M react with each other to make silicide, a portion of the silicide making contact with the gate insulating film has composition expressed with $M_XSi_{1-X}$ (0<X≦0.5).

The present invention further provides a method of fabricating the above-mentioned semiconductor device, including depositing poly-silicon on a gate insulating film and patterning the poly-silicon into a gate electrode having desired dimension, forming a nickel (Ni) film on the gate electrode, thermally annealing the gate electrode and the nickel film to entirely turn the gate electrode to nickel silicide (NiSi), and removing a portion of the nickel film which was not turned into the nickel silicide, by etching, wherein the nickel film has such a thickness t1 above a p-channel device that, when poly-silicon and nickel react with each other to make nickel silicide, a portion of the nickel silicide making contact with the gate insulating film has composition expressed with $Ni_XSi_{1-X}$ (0.6≦X<1), and has such a thickness t2 above a n-channel device that, when poly-silicon and nickel react with each other to make nickel silicide, a portion of the nickel silicide making contact with the gate insulating film has composition expressed with $NixSi_{1-X}$ (0<X≦0.5).

The present invention further provides a method of fabricating the above-mentioned semiconductor device, including depositing poly-silicon on a gate insulating film and patterning the poly-silicon into a gate electrode having desired dimension, forming a nickel (Ni) film on the gate electrode, thermally annealing the gate electrode and the nickel film to entirely turn the gate electrode to nickel silicide (NiSi), and removing a portion of the nickel film which was not turned into the nickel silicide, by etching, wherein the nickel film has such a thickness t1 above a p-channel device that, when poly-silicon and nickel react with each other to make nickel silicide, the nickel silicide has $Ni_3Si$ phase as a principal constituent, and has such a thickness t2 above a n-channel device that, when poly-silicon and nickel react with each other to make nickel silicide, the nickel silicide has one of NiSi phase and $NiSi_2$ phase as a principal constituent.

For instance, a ratio of a thickness $T_{Ni}$ of the nickel film to a thickness $T_{Si}$ of the poly-silicon is defined as $T_{Ni}/T_{Si} \geq 1.60$ to form the gate electrode including $Ni_3Si$ phase as a principal constituent.

For instance, a ratio of a thickness $T_{Ni}$ of the nickel film to a thickness $T_{Si}$ of the poly-silicon is defined as $0.55 \leq T_{Ni}/T_{Si} \leq 0.95$ to form the gate electrode including NiSi phase as a principal constituent.

For instance, a ratio of a thickness $T_{Ni}$ of the nickel film to a thickness $T_{Si}$ of the poly-silicon is defined as $0.28 \leq T_{Ni}/T_{Si} \leq 0.54$, and the gate electrode and the nickel film are thermally annealed at 650 degrees centigrade or higher to form the gate electrode including $NiSi_2$ phase as a principal constituent.

The step of depositing the metal M may include, after forming the metal M above a n-channel device or a p-channel device by the thickness of t2, forming diffusion-preventing layer which is stable to the metal M or nickel, only above the n-channel device, and depositing the metal M or forming the nickel film by the thickness of (t1−t2).

It is preferable that the diffusion-preventing layer can be etched in selected areas relative to silicide of the metal M.

It is preferable that the diffusion-preventing layer contains one of TiN and TaN as a primary constituent.

It is preferable that the gate electrode and the metal M or the nickel film are thermally annealed for silicidation at such a temperature that a resistance of metal silicide formed in a diffusion contact region of the semiconductor device is not increased.

The present invention further provides a method of fabricating the above-mentioned semiconductor device, including depositing poly-silicon on a gate insulating film and patterning the poly-silicon into a gate electrode having desired dimension, forming a nickel (Ni) film on the gate electrode, thermally annealing the gate electrode and the nickel film to entirely turn the gate electrode to nickel silicide (NiSi), and removing a portion of the nickel film which was not turned into the nickel silicide, by etching, wherein a ratio of a thickness $T_{Ni}$ of the nickel film to a thickness $T_{Si}$ of the poly-silicon is defined as $1.60 \leq T_{Ni}/T_{Si}$.

In the specification, the term "high dielectric constant" (High-k) is used for distinguish from an insulating film composed of silicon dioxide ($SiO_2$) and conventionally used as a gate insulating film, and means a higher dielectric constant than the same of an insulating film composed of silicon dioxide ($SiO_2$). A specific numerical range of "high dielectric constant" is not to be limited.

In accordance with the present invention, a gate electrode is composed of silicide. This ensures avoiding depletion in a gate electrode, and makes it possible to control a work function of a gate electrode to be formed on a gate insulating film having a high dielectric constant by controlling composition of the silicide, though the control of a work function was said quite difficult. Accordingly, it is possible to control a threshold voltage (Vth) suitably to each of devices by applying a silicide electrode having appropriate composition to p-type and n-type MOSFETs.

Since the composition of silicide is determined in self-aligning manner in accordance with a primary crystal phase of the silicide, it would be possible to have a broad process margin, making it possible to suppress fluctuation in a threshold voltage (Vth).

In addition, it is possible to avoid a contact silicide layer formed in a source/drain diffusion region from being highly resistive, by selecting a metal such as nickel applicable to a low-temperature salicide process.

Since the method of fabricating a semiconductor device in accordance with the present invention does not include a step of, after a poly-Si electrode was formed on a gate insulating film, removing the poly-Si electrode, the gate insulating film is not exposed at a surface thereof to wet-etchant or organic solvents a couple of times. Accordingly, it is possible to present a CMOSFET including a metal gate electrode and a gate insulating film having a high dielectric constant both of which are superior in reliability.

BRIEF DESCRIPTION OF THE DRAWINGS

FIG. 1 is a cross-sectional view of a first conventional CMOSFET.

FIG. 2 is a cross-sectional view of a second conventional CMOSFET which is also in accordance with a reference example 2.

FIG. 3 is a cross-sectional view of a CMOSFET in accordance with the first embodiment of the present invention.

Each of FIGS. 4A to 4J is a cross-sectional view of a CMOSFET, illustrating a step of the method of fabricating a CMOSFET in accordance with the first embodiment of the present invention.

FIG. 5 illustrates wave-forms indicating the measurement results of X-ray diffraction (XRD) and Rutherford back-scattering (RBS) in each of crystal phases of Ni silicide in the CMOSFET in accordance with the first embodiment of the present invention.

FIG. 6 is a graph showing a relation between a gate capacity (C) and a gate voltage (V) in the CMOSFET including a Ni silicide gate electrode having composition controlled in accordance with the first embodiment, and further including a gate insulating film comprised of a HFSiON film as a film composed of a material having a high dielectric constant.

FIG. 7 is a graph showing a relation between a work function estimated based on a flat band voltage, and a composition ratio Ni/(Ni+Si) of a Ni silicide gate electrode.

FIG. 8 is a graph showing a range of a threshold voltage of a transistor accomplished by a work function of a Ni silicide gate electrode fabricated in accordance with the first embodiment.

FIG. 9 is a graph showing the dependency of a drain current on a gate voltage in a n-type MOSFET having a Ni silicide gate electrode fabricated in accordance with the first embodiment.

FIG. 10 is a graph showing a relation between electron mobility and an intensity of effective electric field in a n-type MOSFET fabricated in accordance with the first embodiment.

FIG. 11 is a cross-sectional view of the reference example 1 relative to a CMOSFET fabricated in accordance with the first embodiment of the present invention.

FIG. 12 is a graph showing a relation between a gate capacity (C) and a gate voltage (V) in a p-type MOSFET in accordance with the reference example 1.

FIG. 13 is a graph showing the dependency of both a work function of a NiSi electrode formed on a $SiO_2$ film and a work function of a NiSi electrode formed on a HFSiON film, on doses of impurities, the dependency being determined based on the C-V curves of p-type and n-type MOSFETs.

DESCRIPTION OF THE PREFERRED EMBODIMENTS

The present invention is based on the discovery that when a CMOSFET is designed to include a gate insulating film having a high dielectric constant for enhancing performances thereof, a n-type MOSFET is designed to have a gate electrode composed of silicon-rich silicide, and a p-type MOSFET is designed to have a gate electrode composed of metal-rich silicide, ensuring that slight change in silicide composition causes significant change in a work function.

The above-mentioned phenomenon is relevant to pinning (which is mentioned later in the reference example 1) of an electrode Fermi-level, caused when a poly-Si electrode is formed on a HfSiON film. Such significant change in a work function cannot be obtained, if a gate insulating film is composed of $SiO_2$.

Specifically, if a silicon-rich silicide electrode is formed, for instance, on a HFSiON film as an electrically insulating film having a high dielectric constant, the influence caused by Fermi-level pinning at a poly-Si/HfSiON interface before being silicided remains as it is without being cancelled. Thus, a work function of the silicide electrode is close to 4.1 to 4.3 eV during which Fermi-level pinning of a poly-Si electrode formed on a HFSiON film exists.

In contrast, Fermi-level pinning is weaker in a silicide electrode containing a metal at a higher concentration. Thus, a work function (4.8 eV) substantially inherent to silicide is reflected onto a gate electrode.

Furthermore, in the present invention, there is used a metal which can completely turn poly-Si into silicide at a low temperature.

Specifically, it is preferable to turn poly-Si into silicide at a temperature in the range of 350 to 500 degrees centigrade, because a resistance of metal silicide formed in a contact region of a source/drain diffusion layer is not increased at the temperature.

In the present invention, there is used a metal which is capable of forming both a silicon-rich crystal phase and a metal-rich crystal phase at 350 to 500 degrees centigrade.

It is possible to determine a composition of a gate electrode in self-aligning manner by using the above-mentioned metal for turning a poly-Si electrode into silicide therewith, ensuring that fluctuation in a CMOS process can be suppressed.

As is obvious in light of the explanation made above, nickel (Ni) is preferable as a metal M in silicide. The use of Ni makes it possible to completely turn poly-Si into silicide even when an annealing temperature is equal to or smaller than 450 degrees centigrade. Furthermore, it is further possible to gradually change a composition of crystal phase by changing Ni supply.

It is preferable for the above-mentioned reasons that, assuming that a region of nickel silicide making contact with a HFSiON film is expressed with $Ni_XSi_{1-X}$ (0<X<1), the X is equal to or greater than 0.6, but smaller than 1 (0.6≦X<1) in Ni silicide of which a gate electrode is composed in a p-type MOSFET, and the X is greater than 0 and equal to or smaller than 0.5 (0<X≦0.5) in Ni silicide of which a gate electrode is composed in a n-type MOSFET.

It is more preferable that, assuming that a region of nickel silicide making contact with a HfSiON film is expressed with $Ni_XSi_{1-X}$ (0<X<1), the X is greater than 0.6, but smaller than 0.8 (0.6≦X<0.8) in Ni silicide of which a gate electrode is composed in a p-type MOSFET, and the X is greater than 0.3 and smaller than 0.55 ($0.3<X\leq 0.55$) in Ni silicide of which a gate electrode is composed in a n-type MOSFET. This is because that crystal phases of Ni are grouped primarily into NiSi$_2$, NiSi, Ni$_3$Si$_2$, Ni$_2$Si and Ni$_3$Si, and these compounds can be formed in dependence on thermal history.

It is most preferable that, assuming that a region of nickel silicide making contact with a HfSiON film is expressed with Ni$_x$Si$_{1-X}$ ($0<X<1$), the X is greater than 0.7, but smaller than 0.8 ($0.7\leq X<0.8$) in Ni silicide of which a gate electrode is composed in a p-type MOSFET, and the X is greater than 0.45 and smaller than 0.55 ($0.45<X\leq 0.55$) in Ni silicide of which a gate electrode is composed in a n-type MOSFET. That is, it is preferable that silicide contained in a gate electrode in a p-type MOSFET primarily contains Ni$_3$Si phase, and silicide contained in a gate electrode in a n-type MOSFET primarily contains NiSi phase.

The metal M is not to be limited to Ni. As the metal M, there may be used tantalum (Ta), platinum (Pt), cobalt (Co), titanium (Ti), hafnium (Hf), vanadium (V), chromium (Cr), zirconium (Zr) or niobium (Nb), for instance, if they can turn poly-Si into silicide at such a temperature that a resistance of metal silicide formed in a contact area in a source/drain diffusion layer is not increased, and further if it is possible to form both silicon-rich crystal phase and metal-rich crystal phase at the temperature.

Furthermore, in the present invention, a gate electrode contains silicide of metal M as a primary constituent, expressed with M$_x$Si$_{1-X}$ ($0<X<1$), and the X is greater than 0.5 ($X>0.5$) in the silicide of metal M contained in a gate electrode formed above a p-channel, and the X is equal to or smaller than 0.5 ($X\leq 0.5$) in the silicide of metal M contained in a gate electrode formed above a n-channel.

The use of the metal silicide meeting the above-mentioned conditions makes it possible not only to suppress reduction in a drain current in a transistor, caused by depletion of a conventionally used gate electrode composed of poly-Si, but also to provide the following advantages.

(1) It is possible to control a work function in a gate insulating film having a high dielectric constant, though the work function control was quite difficult in a conventional silicide electrode.

(2) Since it is possible to control silicide composition with crystal phases of silicide, and further it is possible to control crystal phases of silicide with a thickness of a metal film formed on poly-Si, large margin in fabrication conditions is ensured, and reproducibility of transistors can be enhanced.

(3) The use of metal-rich silicide can make a range in which a work function is modulated broader than mid-gap of silicon.

(4) The use of metal-rich silicide can make it possible to select a low-temperature silicidation process.

(5) Since it is not necessary to change constituent composition of a gate electrode, it is no longer necessary to carry out a step of etching for removal a film deposited on a gate insulating film unlike a conventional process. This ensures it possible to prevent a gate insulating film from being damaged by etching.

(6) It is possible to carry out a salicide process in a silicide fabrication process, ensuring simplification in steps of fabricating a gate electrode.

In the explanation made above, a composition of a gate electrode and a profile of crystal phase in a depth-wise direction are not mentioned. However, since a threshold voltage (Vth) of a MOSFET is dependent on a combination of a gate insulating film and a gate electrode disposed adjacent thereto, if constituents, composition and/or crystal phases in a region at which a gate electrode and a gate insulating film make contact with each other meet the conditions required in the present invention, it would be possible to obtain the advantages of the present invention, even if constituents and/or crystal phases in a region of a gate electrode not making contact with a gate insulating film are different from the above-mentioned ones, or even if a gate electrode has a composition varying in a depth-wise direction.

Embodiments in accordance with the present invention are explained hereinbelow with reference to the drawings.

Embodiment 1

FIG. 3 is a cross-sectional view of a CMOSFET in accordance with the first embodiment of the present invention.

The CMOSFET in accordance with the first embodiment includes a silicon substrate 1. Device separation films 2 are formed at a surface of the silicon substrate 1. A n-type MOSFET and a p-type MOSFET are to be fabricated in a device-fabrication region defined between the device separation films 2 disposed adjacent to each other.

The n-type MOSFET is comprised of a silicon dioxide (SiO$_2$) layer 3 formed on the silicon substrate 1 as a gate insulating film, a HfSiON layer 18 formed on the silicon dioxide layer 3, and a gate electrode 19 formed on the HfSiON layer 18. The gate electrode 19 in the n-type MOSFET is composed of Ni$_x$Si$_{1-X}$ ($0<X\leq 0.5$).

The p-type MOSFET is comprised of a silicon dioxide (SiO$_2$) layer 3 formed on the silicon substrate 1, a HFSiON layer 18 formed on the silicon dioxide layer 3, and a gate electrode 20 formed on the HFSiON layer 18. The gate electrode 20 in the p-type MOSFET is composed of Ni$_x$Si$_{1-X}$ ($0.6\leq X<1$).

As mentioned later, it is not always necessary to form the HfSiON layer 18 in both of the n-type and p-type MOSFETs.

Since the n-type and p-type MOSFETs have the same structure as each other, hereinbelow is explained only a structure of the n-type MOSFET.

A gate sidewall 7 is formed on the silicon substrate 1, surrounding the silicon dioxide layer 3, the HfSiON layer 18 and a sidewall of the gate electrode 19 therewith. An interlayer insulating film 11 is formed on the silicon substrate 1, covering the gate sidewall 7 therewith such that the gate electrode 19 is exposed.

A silicide layer 10 is formed at a surface of the silicon substrate 1 around the gate sidewall 7. An extended diffusion layer region 6 is formed in the silicon substrate 1 around the gate electrode 19, and source/drain diffusion layers 8 are formed around the gate sidewall 7 and below the extended diffusion layer region 6.

FIGS. 4A to 4J are cross-sectional views each showing a step of a method of fabricating the CMOSFET in accordance with the embodiment 1. Hereinbelow is explained the method of fabricating the CMOSFET in accordance with the embodiment 1, with reference to FIGS. 4A to 4J.

In the method of fabricating the CMOSFET in accordance with the embodiment 1, the interlayer insulating film, after having been formed, is polished to be flattened, and simultaneously, n-type and p-type MOSFETs are fabricated by means of CMP (Chemical Mechanical Polishing) which exposes upper portions of the gate electrodes.

First, as illustrated in FIG. 4A, the device separation films 2 are formed at a surface of the silicon substrate 1 by means of STI (Shallow Trench Isolation) process.

Then, the gate insulating film 3 is formed at a surface of the silicon substrate 1 in a device-fabrication region defined by the device separation films 2. The gate insulating film 3 is comprised of an electrically insulating film having a high dielectric constant and composed of metal oxide, metal silicate, metal oxide into which nitrogen is doped, or metal silicate into which nitrogen is doped.

In particular, it is preferable that the gate insulating film 3 contains Hf or Zr. This is because an electrically insulating film containing Hf or Zr is stable to annealing to be carried out at a high temperature, and it is possible to cause the film to contain a small amount of fixed electric charges therein.

Furthermore, it is preferable to form a layer containing Hf or Zr such that the layer makes contact with a gate electrode comprised of an electrically insulating film having a high dielectric constant. This is because a threshold voltage of a MOSFET is dependent on a combination of a gate electrode and a film having a high dielectric film and making contact with the gate electrode.

A silicon oxide film or a silicon oxide nitride film may be formed between the electrically insulating film and the silicon substrate 1 in order to reduce an interfacial level at an interface between the silicon substrate 1 and the gate insulating film 3 and further reduce the influence caused by fixed electric charges included in the electrically insulating film.

It is more preferable that a HfSiON film may be formed in place of the silicon oxide film or the silicon oxide nitride film. As an alternative, the HfSiON film 18 may be formed on the silicon oxide film or the silicon oxide nitride film (in FIGS. 4A to 4J, only the gate insulating film 3 is illustrated, and the HfSiON film 18 is omitted for simplification).

In the embodiment 1, a concentration of Hf in the gate insulating film 3 varies in a depth-wise direction thereof. The HFSiON layer 18 has a highest concentration of Hf in the vicinity of an interface between the gate electrode and the gate insulating film 3, and has a composition of a thermally oxidized silicon film in the vicinity of an interface between the silicon substrate 1 and the gate insulating film 3.

In order to the HfSiON film 18 having the above-mentioned structure, a thermally oxidized silicon film is first formed by the thickness of 1.9 nm. Then, Hf is deposited on the thermally oxidized silicon film by the thickness of 0.5 nm by a long-throw sputtering process. Then, the resultant is thermally annealed twice, firstly at 500 degrees centigrade in oxygen atmosphere for one minute, and secondly at 800 degrees centigrade in nitrogen atmosphere for thirty seconds. This results in that Hf is diffused into the underlying silicon oxide film in solid phase, and thereby there is formed a HfSiON film. Thereafter, the HfSiON film is annealed at 900 degrees centigrade in $NH_3$ atmosphere for ten minutes to thereby fabricate the HFSiON film 18.

Then, a multi-layered structure comprised of the poly-silicon (poly-Si) film 4 having a thickness of 40 nm and the silicon oxide film 5 having a thickness of 150 nm is formed on the gate insulating film 3.

As illustrated in FIG. 4B, the multi-layered structure is patterned into a gate electrode 4a by lithography and reactive ion etching (RIE). Then, ions are doped into the silicon substrate 1 with the gate electrode 4a being used as a mask to thereby form the extended diffusion layer region 6 around the gate electrode 4a in a self-aligning manner.

Then, as illustrated in FIG. 4C, a silicon oxide film and a silicon nitride film are successively formed. Then, those films are etched back to thereby form the gate sidewall 7 on a sidewall of the gate electrode 4a.

Then, ions are doped again into the silicon substrate 1. Then, the silicon substrate 1 is annealed for activating the ions to form the source/drain diffusion layers 8 beneath the extended diffusion layer region 6.

Then, as illustrated in FIG. 4D, a metal film 9 is formed entirely on the silicon substrate by sputtering by the thickness of 20 nm.

Then, as illustrated in FIG. 4E, a silicide layer 10 is formed in accordance with the salicide process by the thickness of about 40 nm only at areas disposed above the source/drain diffusion layers 8 with the gate electrode 19, the gate sidewall 7 and the device separation films 2 being used as a mask.

The silicide layer 10 is composed of Ni mono-silicide (NiSi) for minimizing a contact resistant thereof. In place of Ni silicide, the silicide layer 10 may be composed of Co silicide or Ti silicide.

Then, as illustrated in FIG. 4F, an interlayer insulating film 11 comprised of a silicon oxide film is formed entirely on the silicon substrate 1 by CVD (Chemical Vapor Deposition).

Then, as illustrated in FIG. 4G, the interlayer insulating film 11 is flattened by CMP. Then, the interlayer insulating film 11 is etched back to make the poly-silicon film 4 of the gate electrode 4a exposed.

Then, as illustrated in FIG. 4H, a first metal film 12 is formed entirely on the silicon substrate 1 for making silicide of the gate electrode 4a and the poly-silicon film 4.

A metal of which the first metal film 12 is composed is selected from metals which make silicide with the poly-silicon film 4, for instance, selected from Ni, Pt, Hf, V, Ti, Ta, W, Co, Cr, Zr, Mo, Nb or alloys thereof. It is preferable to select a metal which is capable of turning the poly-silicon film 4 into silicide at such a temperature that a resistance of the silicide layer 10 formed in the source/drain diffusion layers 8 is not increased.

For instance, if a nickel mono-silicide (NiSi) layer is formed in the source/drain diffusion layers 8, it would be necessary to carry out the subsequent process at 500 degrees centigrade or lower in order to prevent a contact resistance between the source/drain diffusion layers 8 and wirings from increasing due to disilicidation of nickel ($NiSi_2$). Accordingly, nickel is selected in the embodiment 1, because silicidation can be well accomplished at 500 degrees centigrade of lower.

The first metal film 12 composed of nickel is formed so as to have such a thickness t2 that when the poly-silicon film 4 and nickel sufficiently react with each other into silicide, a portion of the silicide making contact with the gate insulating film 3 has a composition defined as $Ni_xSi_{1-x}$ ($0<X\leq0.5$).

It is preferable that the first metal film 12 has such a thickness that the silicide film to be formed after the silicidation contains NiSi phase or $NiSi_2$ phase as a primary constituent. This is because a work function of the silicide film containing NiSi phase or $NiSi_2$ phase as a primary constituent can be set in the range of 4.4 to 4.5 eV relative to HfSiON.

In the embodiment 1, the first metal film 12 is comprised of a nickel film formed at a room temperature by DC magnetron sputtering by the thickness of 22 nm.

A diffusion-preventing layer 13 is formed entirely on the first metal film 12 comprised of a nickel film in order to prevent nickel diffusion.

A material of which the diffusion-preventing layer 13 is composed is selected from materials which can prevent diffusion of metal to be turned into silicide in a thermally annealing step to be carried out for completely turning gate poly-silicon into silicide, and further, which is stable.

It is preferable that the diffusion-preventing layer 13 can be etched in selected areas relative to the silicided metal and the interlayer insulating film 11, because the process of fabricating a transistor can be simplified.

In the embodiment 1, the diffusion-preventing layer 13 is comprised of a TiN film formed at 300 degrees centigrade by reactive sputtering by the thickness of 20 nm.

Then, as illustrated in FIG. 4I, only a portion of the TiN film 13 disposed above the first metal film (Ni film) 12 in the p-type MOSFET is removed by lithography and RIE.

Then, a second metal film 14 identical in constituent with the first metal film 12 is formed entirely on the silicon substrate for making silicide. In the embodiment 1, a nickel is formed as the second metal film 14.

The second metal film 14 comprised of a nickel film is designed to have such a thickness t1 that when the poly-silicon film 4 sufficiently reacts with nickel contained in the first and second metal films 12 and 14 having a total thickness of (t1+t2) to thereby turn into silicide, a portion of the silicide making contact with the gate insulating film 3 has a composition defined as $NixSi_{1-X}$ (0.5<X<1).

It is preferable that the second metal film 14 such a thickness t1 that a portion of the silicide making contact with the gate insulating film 3 has a composition defined as $Ni_XSi_{1-X}$ (0.6≦X<1). This is because nickel silicide including nickel twice or more greater than silicon has a work function of 4.6 eV on HFSiON.

It is more preferable that the second metal film 14 such a thickness t1 that the resultant silicide includes $Ni_3Si$ phase as a primary constituent. This is because silicide including $Ni_3Si$ phase as a primary constituent has a work function of 4.8 eV on HFSiON.

In the embodiment 1, a nickel film as the second metal film 14 is formed at a room temperature by DC magnetron sputtering by the thickness of 44 nm. Accordingly, a nickel film having a total thickness of 66 nm (a nickel film as the first metal film 12 has a thickness of 22 nm, and a nickel film as the second metal film 14 has a thickness of 44 nm) contributes to the silicidation above the gate insulating film 3 in the p-type MOSFET, whereas only a nickel film as the first metal film 12 (a thickness of 22 nm) disposed beneath the diffusion-preventing layer 13 contributes to the silicidation above the gate insulating film 3 in the n-type MOSFET.

Then, a thermally annealing step is carried out for turning the poly-silicon film 4 formed on the gate insulating film 3, the first metal film 12, and the second metal film 14 into silicide. It is necessary to carry out the thermally annealing step in non-oxidizing atmosphere in order to prevent the metal films from being oxidized, and it is further necessary to carry out the thermally annealing step at such a temperature that a sufficient diffusion speed can be accomplished for entirely turning the poly-silicon film 4 formed on the gate insulating film 3 into silicide, and the silicide layer 10 formed in the source/drain diffusion layers 8 does not become highly resistive.

In the embodiment 1, since the silicide layer 10 formed on the source/drain diffusion layers 8 and the silicide formed on the gate electrode 4a are both nickel silicide, the above-mentioned thermal annealing is carried out at 450 degrees centigrade in nitrogen gas atmosphere for two minutes.

The above-mentioned thermal annealing may be carried out at a higher temperature, if the silicide layer 10 formed on the source/drain diffusion layers 8 is Co silicide or Ti silicide. For instance, the thermal annealing may be carried out at 800 degrees centigrade, for instance.

As a result of carrying out the above-mentioned thermal annealing, the poly-silicon film 4 reacts with the nickel film as the first metal film 12 having a thickness of 22 nm to thereby turn into silicide in the n-type MOSFET, and the poly-silicon film 4 reacts with the nickel films 12 and 14 having a total thickness of 66 nm to thereby turn into silicide in the p-type MOSFET.

Thus, as illustrated in FIG. 4J, there are formed the gate electrodes 19 and 20 in the n-type and p-type MOSFETs, respectively.

Since a larger amount of nickel can be supplied to the poly-silicon film 4 in the p-type MOSFET than in n-type MOSFET, the Ni silicide gate electrode 20 contains nickel in a higher concentration than the Ni silicide gate electrode 19 of the n-type MOSFET.

FIG. 5 illustrates wave-forms indicating the measurement results of X-ray diffraction (XRD) and Rutherford back-scattering (RBS) in each of crystal phases of Ni silicide.

As illustrated in FIG. 5, when the nickel film has the above-mentioned thickness in the embodiment 1, the nickel silicide gate electrode 19 of the n-type MOSFET is comprised singly of NiSi phase, and a composition ratio Ni/(Ni+Si) is about 0.5. In contrast, the nickel silicide gate electrode 20 of the p-type MOSFET is comprised of combined phases of NiSi phase and $Ni_3Si$ phase as a main phase, and a composition ratio Ni/(Ni+Si) is about 0.75.

Then, portions of the nickel films 12 and 14 and the TiN film 13 which do not contribute to silicidation in the thermally annealing step are removed by etching through the use of aqueous solution of sulfuric acid hydrogen peroxide.

In the above-mentioned steps, peeling of the gate electrodes 19 and 20 was not observed at all.

By carrying out the above-mentioned steps, as illustrated in FIG. 4J, there is fabricated a CMOSFET including the nickel full-silicide electrodes 19 and 20 having different compositions from each other in the n-type and p-type MOSFETs.

As shown in Table 1, crystal phase of nickel silicide is dependent on a thickness of the nickel film formed on the poly-silicon film 4, that is, an amount of nickel to be supplied to the poly-silicon film 4.

TABLE 1

| | | $T_{Ni}/T_{Si}$ | | | |
|---|---|---|---|---|---|
| | | 0.33 | 0.67 | 1.20 | 1.80 |
| Annealing Temp. (Centigrade) | 650 | $NiSi_2$ + NiSi | | | |
| | 600 | NiSi | | | |
| | 500 | NiSi | NiSi | | NiSi + $Ni_3Si$ |
| | 450 | | NiSi | | NiSi + $Ni_3Si$ |
| | 400 | | NiSi | NiSi | NiSi + $Ni_3Si$ |

The inventors had discovered that when a gate electrode of a n-type MOSFET is comprised of NiSi phase, a ratio ($T_{Ni}/T_{Si}$) between a thickness ($T_{Si}$) of a gate poly-silicon film and a thickness ($T_{Ni}$) of a nickel film is preferably in the range of 0.55 to 0.95, and when a gate electrode of a p-type MOSFET is comprised of silicide containing $NiSi_3$ phase as a primary constituent, the ratio ($T_{Ni}/T_{Si}$) is preferably equal to or greater than 1.60.

However, when a gate electrode is comprised of silicide containing $NiSi_2$ phase as a primary constituent, it is necessary to determine the ratio ($T_{Ni}/T_{Si}$) in the range of 0.28 to 0.54, and to turn poly-silicon into silicide at 650 degrees centigrade or greater.

Furthermore, since the composition Ni/(Ni+Si) on which a work function of nickel silicide is dependent is determined by crystal phases such as $NiSi_2$, NiSi, $Ni_2Si$ or $Ni_3Si$ almost in self-aligning manner, it is possible to ensure wide margin in process conditions such as a total thickness of deposited nickel films or a temperature at which poly-silicon is turned into silicide both for providing common crystal phase (that is, an identical work function), and to reduce fluctuation in fabrication process.

In accordance with the above-mentioned steps, it is possible to fabricate a CMOSFET including n-type and p-type MOSFETS having gate electrodes composed of Ni silicide wherein composition ratios of the gate electrodes are different from each other, and a nickel concentration of the nickel silicide gate electrode of the p-type MOSFET is higher than the same of the nickel silicide gate electrode of the n-type MOSFET.

FIG. 6 is a graph showing a relation between a gate capacity (C) and a gate voltage (V) in a CMOSFET including a nickel silicide gate electrode having a composition controlled in accordance with the embodiment 1, and further including the gate insulating film 3 comprised of a HfSiON film composed of a material having a high dielectric constant.

In FIG. 6 are shown three C-V curves in each of which a ratio ($T_{Ni}/T_{Si}$) between a thickness ($T_{Si}$) of a gate poly-silicon film and a thickness ($T_{Ni}$) of a nickel film is 0.33, 0.67 and 1.80. As is understood in view of FIG. 6, a flat band voltage in the C-V curves shifts in accordance with the ratio ($T_{Ni}/T_{Si}$).

FIG. 7 is a graph showing a relation between a work function estimated based on a flat band voltage, and a composition ratio Ni/(Ni+Si) of a Ni silicide gate electrode.

The compositions Ni/(Ni+Si) associated with the three solid circles illustrated in FIG. 7 indicate $NiSi_2$, NiSi and $Ni_3Si$, respectively, from the left. It is understood that a work function of nickel silicide formed on a HfSiON film is determined in association with a composition ratio of a nickel silicide gate electrode determined by these crystal phases in a self-aligning manner. Specifically, work functions in association with $NiSi_2$, NiSi and $Ni_3Si$ are about 4.4 eV, about 4.5 eV and about 4.8 eV, respectively.

FIG. 8 is a graph showing a relation between a threshold voltage (Vth) of a CMOSFET and an amount of channel impurities.

FIG. 8 illustrates a range of a threshold voltage (Vth) of a MOSFET estimated based on the above-mentioned work function relative to channel impurities. That is, it is understood that a nickel silicide gate electrode composed of NiSi (having a work function of about 4.5 eV) or $NiSi_2$ (having a work function of about 4.4 eV) is applicable to a n-type MOSFET, and a nickel silicide gate electrode composed of $Ni_3Si$ (having a work function of about 4.8 eV) is applicable to a p-type MOSFET.

FIG. 9 is a graph showing the dependency of a drain current on a gate voltage in a n-type MOSFET having a Ni silicide gate electrode, and FIG. 10 is a graph showing a relation between electron mobility and an intensity of effective electric field in a n-type MOSFET.

As illustrated in FIG. 9, a threshold voltage (Vth) of a n-type MOSFET including a nickel silicide gate electrode is equal to a threshold voltage (Vth) having been estimated with reference to FIG. 8.

In addition, as illustrated in FIG. 10, the carrier mobility of the transistor is equal to carrier mobility of a poly-Si/$SiO_2$ transistor.

As is obvious in light of the explanation made above, a combination of the NiSi gate electrode and the HFSiON gate insulating film, shown in the embodiment 1, could present superior transistor performances.

Reference Example 1

FIG. 11 is a cross-sectional view of the reference example 1 in comparison with the embodiment 1.

In the reference example 1 illustrated in FIG. 11, the gate insulating film 3 is comprised of a film composed of a material having a high dielectric constant, and the gate electrode is composed of poly-silicon. Specifically, the gate electrode 21 of a n-type MOSFET is comprised of a n+ poly-silicon electrode, and the gate electrode 22 of a p-type MOSFET is comprised of a p+ poly-silicon electrode.

The same steps as the steps carried out until the gate insulating film 3 was formed in the embodiment 1 were carried out. Then, poly-silicon was deposited over the silicon substrate, and subsequently, the poly-silicon was etched into the gate electrodes 21 and 22 without forming the interlayer insulating film 11 on the poly-silicon.

Then, the gate sidewall 7 was formed in the same way as the embodiment 1. When the source/drain diffusion layers 8 were formed, impurities were doped into the poly-silicon of which the gate electrodes 21 and 22 were composed. Specifically, phosphorus (P) was doped into the poly-silicon electrode 21 of the n-type MOSFET at 3E15 ($cm^{-2}$), and boron (B) was doped into the poly-silicon electrode 22 of the p-type MOSFET at 3E15 ($cm^{-2}$).

After activation of the impurities, nickel silicide was formed on the source/drain diffusion layers 8 and the poly-silicon gate electrodes 21 and 22 in accordance with a salicide process, similarly to the embodiment 1. The nickel silicide formed on the gate electrodes 21 and 22 does not reach the gate insulating film 3.

FIG. 12 is a graph showing a relation between a gate capacity (C) and a gate voltage (V) in the thus fabricated p-type MOSFET in accordance with the reference example 1.

Since the gate electrodes 21 and 22 are composed of poly-silicon, depletion occurs in the electrodes, and there further occurs capacity reduction in an inverted region which is equivalent to about 5 angstrom increase of EOT.

Furthermore, pinning of electrode Fermi-level occurs at an interface between the electrodes and an insulating film due to defects at an interface between the poly-silicon and the gate insulating film having a high dielectric constant, resulting in a problem that a threshold voltage of a transistor cannot be controlled.

A work function of poly-silicon obtained by a flat band voltage illustrated in FIG. 9 in the case that a gate insulating film was composed of HfSiON was not dependent on doped impurity, but was fixed around 4.1 to 4.3 eV, resulting in that a threshold voltage (Vth) of the p-type MOSFET was relatively high, specifically in the range of about −1.0 to about −0.8 V.

Reference Example 2

The conventional CMOSFET illustrated in FIG. 1 is used herein as the reference example 2 in comparison with the embodiment 1.

In the reference example 2, as illustrated in FIG. 1, the gate insulating film 3 is comprised of a film composed of thermally oxidized silicon, and the gate electrodes 23 and 24 are comprised of NiSi electrodes as a metal gate electrode in order to avoid depletion of a gate electrode.

The gate insulating film 3 was comprised of a thermally oxidized film having a thickness of 3 nm. After the steps illustrated in FIG. 4A to 4J were carried out in the same way as the embodiment 1, impurity was doped into gate poly-silicon, and then, was annealed for activation. The annealing was carried out in the same conditions as those of the embodiment 2 except the impurity-doping conditions.

A dosed amount of phosphorus (P) and boron (B) was in the range of 0 to 5E20 ($cm^{-3}$). After nickel which caused the ratio $T_{Ni}/T_{Si}$ to be equal to 0.55 has been deposited in the same way as the embodiment 1, the gate poly-silicon was annealed at 450 degrees centigrade by two minutes to thereby make nickel silicide. The gate electrodes 23 and 24 were comprised fully of NiSi phase. Then, an excessive portion of the nickel was etched for removal.

FIG. 13 is a graph showing the dependency of both a work function of a NiSi electrode formed on a $SiO_2$ film and a work function of a NiSi electrode formed on a HfSiON film, on doses of impurities, the dependency being determined based on the C-V curves of p-type and n-type MOSFETs.

It has been understood that a work function could be varied within a range of 4.4 to 4.7 eV by changing an impurity to another and/or varying a dose of impurity.

Accordingly, it is possible to avoid depletion of a gate electrode through the use of a NiSi electrode into which an impurity is doped, and thus, it is possible to fabricate a metal gate CMOSFET superior in threshold voltage (Vth) control almost without changing a structure of a conventional CMOSFET.

The above-mentioned advantages can be obtained when a gate insulating film is composed of silicon dioxide. The advantages cannot be obtained in a CMOSFET working with low power consumption, in which it is necessary to reduce a gate leakage current.

In order to solve the problem, there was fabricated a CMOSFET in which the gate insulating film 3 in the reference example 2 was replaced with the multi-layered structure, mentioned in the embodiment 1, comprised of a thermally oxidized silicon film and a HfSiON film formed on the thermally oxidized silicon film.

As illustrated in FIG. 13, a work function of the NiSi electrode formed on the HFSiON film is constantly equal to 4.5 eV regardless of a dose. Thus, it has been understood that it was not possible to control a work function of the NiSi electrode formed on the HFSiON film by varying a dose of impurity contained in NiSi. Accordingly, a threshold voltage in a p-type MOSFET which is high due to Fermi pining occurring at an interface between a poly-silicon film and a HfSiON film can be lowered only by about 0.1 V, and hence, it is not possible to accomplish a threshold voltage required in CMOSFET working with low power consumption.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, as mentioned in the embodiment 1, a combination of a metal with which a gate electrode is turned into silicide and a metal with which source/drain diffusion layers are turned into silicide is required to meet the condition that gate poly-silicon can be turned into silicide at such a temperature that the silicide of which the source/drain diffusion layers are composed is not altered. By managing the conditions such as an annealing temperature or time for carrying out annealing in accordance with a combination of metals used for silicidation, it would be possible to have desired advantages.

For instance, even if it is quite difficult to accomplish silicidation at a low temperature with a certain metal, it would be sometimes possible to accomplish silicidation with the certain metal by carrying out annealing for a long time.

Furthermore, it is also possible to lower a temperature at which silicidation can be accomplished, by replacing poly-silicon formed on a gate insulating film with amorphous silicon, or controlling a temperature at which a metal film to be turned into silicide is formed. If necessary, the replacement of poly-silicon with amorphous silicon and the temperature control are both carried out.

The invention claimed is:

1. A semiconductor device comprising a silicon substrate, a gate insulating film formed on said silicon substrate, and a gate electrode formed on said gate insulating film,
wherein at least a region of said gate electrode making contact with said gate insulating film is composed of silicide containing $Ni_3Si$ phase as a principal constituent.

2. The semiconductor device as set forth in claim 1, wherein said gate insulating film includes an electrically insulating film having a high dielectric constant and containing one of metal oxide, metal silicate and metal oxide or metal silicate containing nitrogen therein.

3. The semiconductor device as set forth in claim 2, wherein said electrically insulating film contains one of Hf and Zr.

4. The semiconductor device as set forth in claim 2, further comprising a layer containing one of Hf and Zr therein between said electrically insulating film and said gate electrode.

5. The semiconductor device as set forth in claim 2, wherein said electrically insulating film has a multi-layered structure including one of a silicon oxide film and a silicon nitride film, and one of a Hf-containing layer and a Zr-containing layer.

6. The semiconductor device as set forth in claim 2, wherein said electrically insulating film contains HfSiON.

7. The semiconductor device as set forth in claim 2, further comprising a HfSiON layer between said electrically insulating film and said gate electrode.

8. The semiconductor device as set forth in claim 2, wherein said electrically insulating film has a multi-layered structure including one of a silicon oxide film and a silicon nitride film, and a HfSiON layer.

9. The semiconductor device as set forth in claim 1, wherein said gate electrode is included in a p-type MOSFET.

10. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains nickel silicide as a primary constituent, and has a region through which said gate electrode makes contact with said gate insulating film and which has a composition expressed with $Ni_xSi_{1-x}$ (0<X<1), and
said X is greater than 0.5 (X>0.5) in said nickel silicide contained in a gate electrode formed above a p-channel, and said X is equal to or smaller than 0.5 (X≦0.5) in said nickel silicide contained in a gate electrode formed above a n-channel.

11. The semiconductor device as set forth in claim 10, wherein said electrically insulating film contains one of Hf and Zr.

12. The semiconductor device as set forth in claim 10, further comprising a layer containing one of Hf and Zr therein between said electrically insulating film and said gate electrode.

13. The semiconductor device as set forth in claim 10, wherein said electrically insulating film has a multi-layered structure including one of a silicon oxide film and a silicon nitride film, and one of a Hf-containing layer and a Zr-containing layer.

14. The semiconductor device as set forth in claim 10, wherein said electrically insulating film contains HfSiON.

15. The semiconductor device as set forth in claim 10, further comprising a HfSiON layer between said electrically insulating film and said gate electrode.

16. The semiconductor device as set forth in claim 10, wherein said electrically insulating film has a multi-layered structure including one of a silicon oxide film and a silicon nitride film, and a HfSiON layer.

17. The semiconductor device as set forth in claim 10, wherein, said gate electrode contains nickel silicide as a primary constituent, and assuming that a region of said nickel silicide making contact with said gate insulating film is expressed with $Ni_xSi_{1-x}$ ($0<X<1$), said X is equal to or greater than 0.6 and smaller than 1 ($0.6 \leq X<1$) in said nickel silicide contained in a gate electrode formed above a p-channel, and said X is greater than 0 and equal to or smaller than 0.5 ($0<X \leq 0.5$) in said nickel silicide contained in a gate electrode formed above a n-channel.

18. The semiconductor device as set forth in claim 10, wherein said nickel silicide contained in said gate electrode formed above said p-channel contains $Ni_3Si$ phase as a principal constituent at least in a region through which said nickel silicide makes contact with said gate insulating film, and said nickel silicide contained in said gate electrode formed above said n-channel contains one of NiSi phase and $NiSi_2$ phase as a principal constituent at least in a region through which said nickel silicide makes contact with said gate insulating film.

19. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains platinum silicide as a primary constituent, and has a region through which said gate electrode makes contact with said gate insulating film and which has a composition expressed with $Pt_xSi_{1-x}$ ($0<X<1$), and
said X is greater than 0.5 ($X>0.5$) in said platinum silicide contained in a gate electrode formed above a p-channel, and said X is equal to or smaller than 0.5 ($X \leq 0.5$) in said platinum silicide contained in a gate electrode formed above a n-channel.

20. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains tantalum silicide as a primary constituent, and has a region through which said gate electrode makes contact with said gate insulating film and which has a composition expressed with $Ta_xSi_{1-x}$ ($0<X<1$), and
said X is greater than 0.5 ($X>0.5$) in said tantalum silicide contained in a gate electrode formed above a p-channel, and said X is equal to or smaller than 0.5 ($X \leq 0.5$) in said tantalum silicide contained in a gate electrode formed above a n-channel.

21. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains titanium silicide as a primary constituent, and has a region through which said gate electrode makes contact with said gate insulating film and which has a composition expressed with $Ti_xSi_{1-x}$ ($0<X<1$), and
said X is greater than 0.5 ($X>0.5$) in said titanium silicide contained in a gate electrode formed above a p-channel, and said X is equal to or smaller than 0.5 ($X \leq 0.5$) in said titanium silicide contained in a gate electrode formed above a n-channel.

22. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains hafnium silicide as a primary constituent, and has a region through which said gate electrode makes contact with said gate insulating film and which has a composition expressed with $Hf_xSi_{1-x}$ ($0<X<1$), and
said X is greater than 0.5 ($X>0.5$) in said hafnium silicide contained in a gate electrode formed above a p-channel, and said X is equal to or smaller than 0.5 ($X \leq 0.5$) in said hafnium silicide contained in a gate electrode formed above a n-channel.

23. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains cobalt silicide as a primary constituent, and has a region through which said gate electrode makes contact with said gate insulating film and which has a composition expressed with $Co_xSi_{1-x}$ ($0<X<1$), and
said X is greater than 0.5 ($X>0.5$) in said cobalt silicide contained in a gate electrode formed above a p-channel, and said X is equal to or smaller than 0.5 ($X \leq 0.5$) in said cobalt silicide contained in a gate electrode formed above a n-channel.

24. A semiconductor device comprising a silicon substrate, a gate insulating film formed on said silicon substrate, and a gate electrode formed on said gate insulating film, in this order,
wherein said gate insulating film includes an electrically insulating film having a high dielectric constant and containing one of metal oxide, metal silicate and metal oxide or metal silicate containing nitrogen therein,
said gate electrode contains zirconium silicide as a primary constituent, and has a region through which said gate electrode makes contact with said gate insulating film and which has a composition expressed with $Zr_xSi_{1-x}$ ($0<X<1$), and said X is greater than 0.5 (X>0.5) in said zirconium silicide contained in a gate electrode formed above a p-channel, and said X is equal to or smaller than 0.5 (X≦0.5) in said zirconium silicide contained in a gate electrode formed above a n-channel.

25. A semiconductor device comprising a silicon substrate, a gate insulating film formed on said silicon substrate, and a gate electrode formed on said gate insulating film, in this order, wherein said gate insulating film includes an electrically insulating film having a high dielectric constant and containing one of metal oxide, metal silicate and metal oxide or metal silicate containing nitrogen therein, said gate electrode contains vanadium silicide as a primary constituent, and has a region through which said gate electrode makes contact with said gate insulating film and which has a composition expressed with $V_xSi_{1-x}$ (0<X<1), and said X is greater than 0.5 (X>0.5) in said vanadium silicide contained in a gate electrode formed above a p-channel, and said X is equal to or smaller than 0.5 (X≦0.5) in said vanadium silicide contained in a gate electrode formed above a n-channel.

26. A method of fabricating a semiconductor device, comprising:

depositing poly-silicon (poly-Si) on a gate insulating film and patterning said poly-silicon into a gate electrode having desired dimension;

depositing one of metals selected from Ni, Pt, Ta, Ti, Hf, Co, Zr and V on said gate electrode;

thermally annealing said gate electrode and said one of metals to entirely turn said gate electrode to silicide of said one of metals; and removing a portion of said one of metals which was not turned into said silicide, by etching, assuming that said one of metals is expressed with M, and said silicide has a portion through which said silicide makes contact with said gate insulating film and which has a composition expressed with $M_xSi_{1-x}$ (0<X<1), wherein said metal M has such a thickness t1 above a p-channel device that, when poly-silicon and said metal M react with each other to make silicide, a portion of said silicide making contact with said gate insulating film has composition expressed with $M_xSi_{1-x}$ (0.5<X<1), and has such a thickness t2 above a n-channel device that, when poly-silicon and said metal M react with each other to make silicide, a portion of said silicide making contact with said gate insulating film has composition expressed with $M_xSi_{1-x}$ (0<X≦0.5).

27. The method as set forth in claim 26, wherein the step of depositing said metal M or forming said nickel film comprises:

after forming said metal M or said nickel film above a n-channel device or a p-channel device by the thickness of t2, forming diffusion-preventing layer which is stable to said metal M or nickel, only above said n-channel device; and depositing said metal M or forming said nickel film by the thickness of (t1−t2).

28. The method as set forth in claim 27, wherein said diffusion-preventing layer can be etched in selected areas relative to silicide of said metal M.

29. The method as set forth in claim 27, wherein said diffusion-preventing layer contains one of TiN and TaN as a primary constituent.

30. The method as set forth in claim 26, wherein said gate electrode and said metal M or said nickel film are thermally annealed for silicidation at such a temperature that a resistance of metal silicide formed in a diffusion contact region of said semiconductor device is not increased.

31. A method of fabricating a semiconductor device, comprising:

depositing poly-silicon on a gate insulating film and patterning said poly-silicon into a gate electrode having desired dimension;

forming a nickel (Ni) film on said gate electrode;

thermally annealing said gate electrode and said nickel film to entirely turn said gate electrode to nickel silicide (NiSi); and removing a portion of said nickel film which was not turned into said nickel silicide, by etching, wherein said nickel film has such a thickness t1 above a p-channel device that, when poly-silicon and nickel react with each other to make nickel silicide, a portion of said nickel silicide making contact with said gate insulating film has composition expressed with $Ni_xSi_{1-x}$ (0.6≦X<1), and has such a thickness t2 above a n-channel device that, when poly-silicon and nickel react with each other to make nickel silicide, a portion of said nickel silicide making contact with said gate insulating film has composition expressed with $Ni_xSi_{1-x}$ (0<X≦0.5).

32. A method of fabricating a semiconductor device, comprising:

depositing poly-silicon on a gate insulating film and patterning said poly-silicon into a gate electrode having desired dimension;

forming a nickel (Ni) film on said gate electrode;

thermally annealing said gate electrode and said nickel film to entirely turn said gate electrode to nickel silicide (NiSi); and removing a portion of said nickel film which was not turned into said nickel silicide, by etching, wherein said nickel film has such a thickness t1 above a p-channel device that, when poly-silicon and nickel react with each other to make nickel silicide, said nickel silicide has $Ni_3Si$ phase as a principal constituent, and has such a thickness t2 above a n-channel device that, when poly-silicon and nickel react with each other to make nickel silicide, said nickel silicide has one of NiSi phase and $NiSi_2$ phase as a principal constituent.

33. The method as set forth in claim 32, wherein a ratio of a thickness $T_{Ni}$ of said nickel film to a thickness $T_{Si}$ of said poly-silicon is defined as $T_{Ni}/T_{Si} \geq 1.60$ to form said gate electrode including $Ni_3Si$ phase as a principal constituent.

34. The method as set forth in claim 32, wherein a ratio of a thickness $T_{Ni}$ of said nickel film to a thickness $T_{Si}$ of said poly-silicon is defined as $0.55 \leq T_{Ni}/T_{Si} \leq 0.95$ to form said gate electrode including NiSi phase as a principal constituent.

35. The method as set forth in claim 32, wherein a ratio of a thickness $T_{Ni}$ of said nickel film to a thickness $T_{Si}$ of said poly-silicon is defined as $0.28 \leq T_{Ni}/T_{Si} \leq 0.54$, and said gate electrode and said nickel film are thermally annealed at 650 degrees centigrade or higher to form said gate electrode including $NiSi_2$ phase as a principal constituent.

36. A method of fabricating a semiconductor device, comprising:

depositing poly-silicon on a gate insulating film and patterning said poly-silicon into a gate electrode having desired dimension;

forming a nickel (Ni) film on said gate electrode;
thermally annealing said gate electrode and said nickel film to entirely turn said gate electrode to nickel silicide (NiSi); and
removing a portion of said nickel film which was not turned into said nickel silicide, by etching,
wherein a ratio of a thickness $T_{Ni}$ of said nickel film to a thickness $T_{Si}$ of said poly-silicon is defined as $1.60 \leqq T_{Ni}/T_{Si}$.

* * * * *